(12) United States Patent
Muramatsu et al.

(10) Patent No.: US 7,088,279 B2
(45) Date of Patent: Aug. 8, 2006

(54) AD CONVERSION METHOD, AD CONVERTER, SEMICONDUCTOR DEVICE FOR DETECTING DISTRIBUTION OF PHYSICAL QUANTITIES, AND ELECTRONIC APPARATUS

(75) Inventors: Yoshinori Muramatsu, Kanagawa (JP); Noriyuki Fukushima, Kanagawa (JP); Yoshikazu Nitta, Tokyo (JP); Yukihiro Yasui, Kanagawa (JP)

(73) Assignee: Sony Corporation, Tokyo (JP)

( * ) Notice: Subject to any disclaimer, the term of this patent is extended or adjusted under 35 U.S.C. 154(b) by 72 days.

(21) Appl. No.: 11/098,986

(22) Filed: Apr. 5, 2005

(65) Prior Publication Data

US 2005/0231624 A1 Oct. 20, 2005

(30) Foreign Application Priority Data

Apr. 12, 2004 (JP) ............................ P2004-116470

(51) Int. Cl.
*H03M 1/12* (2006.01)
(52) U.S. Cl. ...................................................... 341/155
(58) Field of Classification Search ................ 341/155, 341/150, 133; 382/192, 194, 271
See application file for complete search history.

(56) References Cited

U.S. PATENT DOCUMENTS

| | | | | | |
|---|---|---|---|---|---|
| 3,990,000 | A | * | 11/1976 | Digneffe | ...................... 323/322 |
| 4,627,505 | A | * | 12/1986 | Kunz | ............................. 177/1 |
| 4,710,817 | A | * | 12/1987 | Ando | ......................... 348/310 |
| 5,014,056 | A | * | 5/1991 | Moriwaki | .................... 341/161 |
| 6,404,372 | B1 | * | 6/2002 | Heithoff | ..................... 341/155 |

* cited by examiner

*Primary Examiner*—Peguy JeanPierre
(74) *Attorney, Agent, or Firm*—Sonnenschein, Nath & Rosenthal LLP

(57) ABSTRACT

In a solid-state imaging device including an analog-to-digital converter, a clock converter that generates a high-speed clock that is faster than a master clock is provided. A voltage comparator compares a pixel signal input from a vertical signal line for each row control line with a reference voltage, generating pulses having magnitudes corresponding to a reset component or a signal component in a temporal direction. A counter counts the width of pulse signals until completion of the comparison in the voltage comparator based on a clock that is generated based on the high-speed clock, holding a count value at a time of completion of the comparison. A communication and timing controller exercises control so that the voltage comparator performs comparison for the reset component and the counter performs down-counting in a first processing iteration and so that the voltage comparator performs comparison for the signal component and the counter performs up-counting in a second processing iteration.

41 Claims, 12 Drawing Sheets

AD CONVERSION METHOD, AD CONVERTER, SEMICONDUCTOR DEVICE FOR DETECTING DISTRIBUTION OF PHYSICAL QUANTITIES, AND ELECTRONIC APPARATUS

RELATED APPLICATION DATA

The present application claims priority to Japanese Application(s) No(s). P2004-116470 filed Apr. 12, 2004, which application(s) is/are incorporated herein by reference to the extent permitted by law.

BACKGROUND OF THE INVENTION

1. Field of the Invention

The present invention relates to analog-to-digital (AD) conversion methods, AD converters, semiconductor devices for detecting distribution of physical quantities by an array of a plurality of unit elements, and electronic apparatuses. More specifically, the present invention relates to techniques for converting analog output electric signals into digital data, suitably used in electronic apparatuses, for example, a semiconductor device for detecting distribution of physical quantities, such as a solid-state imaging device, that allows reading electric signals representing distribution of physical quantities obtained by an array of a plurality of unit elements that are sensitive to electromagnetic waves input from the outside, such as light or radiation.

2. Description of the Related Art

Semiconductor devices for detecting physical quantities, including a line or matrix of unit elements that are sensitive to electromagnetic waves input from the outside, such as light or radiation, are used in various fields.

For example, in the field of video apparatuses, charge coupled device (CCD), metal oxide semiconductor (MOS), and complementary metal oxide semiconductor (CMOS) solid-state imaging devices for detecting light (an example of electromagnetic wave) as a physical quantity are used. These devices read distribution of physical quantities in the form of electric signals obtained by unit elements (pixels in the case of a solid-state imaging device).

In a type of solid-state imaging device, referred to as an active pixel sensor (APS) or gain cell, a driving transistor for amplification is provided in a pixel signal generator that generates a pixel signal corresponding to signal charges generated by a charge generator. Many CMOS solid-state imaging devices are of the type described above.

In such an active pixel sensor, in order to read pixel signals to the outside, address control is exercised on a pixel unit including an array of unit pixels so that signals can be read from arbitrarily selected individual unit pixels. That is, an active pixel sensor is an example of address-controlled solid-state imaging device.

For example, in an active pixel sensor, which is a type of X-Y-addressed solid-state imaging device including a matrix of unit pixels, each pixel is implemented using an active element of the MOS structure (MOS transistor) or the like so that the pixel itself is capable of amplification. That is, signal charges (photoelectrons) accumulated in a photodiode that functions as a photoelectric converter are amplified by the active element, and the amplified signals are read as image information.

In this type of X-Y-addressed solid-state imaging device, for example, a pixel unit includes a two-dimensional array of a large number of pixel transistors. Accumulation of signal charges corresponding to incident line is started on a line-by-line basis or pixel-by-pixel basis. Current or voltage signals based on the accumulated signal charges are sequentially read from the respective pixels according to addressing. In the case of MOS (including CMOS) solid-state imaging device, as an example of address control, according to a method that is often used, pixels on one row are simultaneously accessed to read pixel signals from the pixel unit on a row-by-row basis.

The analog pixel signals read from the pixel unit are converted into digital data by an analog-to-digital converter as needed. Since the pixel signals are output with signal components added to reset components, true effective signal components must be extracted by taking difference between signal voltage corresponding to reset component and signal voltage corresponding to signal component.

This also applies to a case where analog pixel signals are converted into digital data. Ultimately, a difference signal component representing a difference between a signal voltage corresponding to a reset component and a signal voltage corresponding to a signal component must be converted into digital data. For this purpose, various schemes for AD conversion have been proposed, for example, as described in W. Yang et. al., "An Integrated 800×600 CMOS Image System," ISSCC Digest of Technical Papers, pp. 304–305, February, 1999 (hereinafter referred to as a first non-patent document).

According to the scheme of AD conversion described in the above document, however, AD conversion must be performed separately for a reset component and a signal component, and digital data of a true effective signal component must be obtained by taking a difference between the respective count value. Thus, the scheme is problematic in terms of processing speed. This will be described below.

Construction of Solid-State Imaging Device According to the Related Art

FIG. 13 is a schematic construction diagram of a CMOS solid-state imaging device (CMOS image sensor) according to the related art, in which an AD converter and a pixel unit are mounted on the same semiconductor substrate. As shown in FIG. 13, a solid-state imaging device 1 includes a pixel unit (imaging unit) 10 in which a plurality of unit pixels 3 is arranged in rows and columns, a driving controller 7 provided externally to the pixel unit 10, a counter (CNT) 24, a column processor 26 including column AD circuits 25 provided for the respective columns, a reference-signal generator 27 including a digital-to-analog converter (DAC) for supplying a reference voltage for AD conversion to the column AD circuits 25 in the column processor 26, and an output circuit 28 including a subtractor circuit 29.

The driving controller 7 includes a horizontal scanning circuit (column scanning circuit) 12 that controls column address or column scanning, a vertical scanning circuit (row scanning circuit) 14 that controls row address or row scanning, and a timing controller 21 that receives a master clock CLK0 via a terminal 5a and that generates various internal clocks to control the horizontal scanning circuit 12, the vertical scanning circuit 14, and the like.

The unit pixels 3 are connected to row control lines 15 that are controlled by the vertical scanning circuit 14 and to vertical signal lines 19 that transfer pixel signals to the column processor 26.

Each of the column AD circuits 25 includes a voltage comparator 252 and a data storage unit (latch) 255, and it has a function of an n-bit AD converter. The voltage comparator 252 compares a reference signal RAMP generated by the reference-signal generator 27 with an analog signal obtained for each row control line 15 (H0, H1, . . . ) from the unit pixels 3 via the vertical control lines 19 (V0, V1, . . . ). The data storage unit 255 is a memory that holds a result of counting a time taken by the voltage comparator 252 to finish comparison by the counter 24. The data storage unit 255 includes n-bit latches 1 and 2 that are storage areas independent of each other.

One input terminal RAMP of the voltage comparator 252 receives input of a stairs-like reference signal RAMP generated by the reference-signal generator 27 commonly with the input terminals RAMP of the other voltage comparators 252. The other input terminals of the voltage comparators 252 are connected to the vertical signal lines of the respectively associated columns so that pixel signals from the pixel unit 10 are individually input. Signals output from the voltage comparators 252 are supplied to the data storage units 255. The reference signal RAMP is digitally generated by performing counting based on a count clock CK0 corresponding to the master clock CLK0 (e.g., clock frequencies of these clocks are equal) supplied from the outside of the solid-state imaging device 1 and converting the count value into an analog signal.

The counter 24 performs counting based on the count clock CK0 that is based on the master clock CLK0 (e.g., clock frequencies of these clocks are the same), and supplies count outputs CK1, CK2, . . . , CKn, together with the count clock CK0, commonly to the column AD circuits 25 of the column processor 26.

That is, by providing lines for the count outputs CK1, CK2, . . . , CKn from the counter 24 to the latches of the data storage units 255 provided for the respective columns, the column AD circuits 25 for the respective columns share the single counter 24.

The outputs of the column AD circuits 25 are connected to horizontal signal lines 18. The horizontal signal lines 18 have signal lines for 2n bits, and are connected to the subtractor circuit 29 of the output circuit 28 via 2n sensing circuits (not shown) associated with the respective output lines.

The timing controller 21 instructs, via a control line 12c, the horizontal scanning circuit 12 to read pixel data. In response to the instruction, the horizontal scanning circuit 12 sequentially transfers pixel data held in the latches 1 and 2 to the subtractor circuit 29 of the output circuit 28 by sequentially shifting a horizontal select signal CH(i). That is, the horizontal scanning circuit 12 performs read scanning in the horizontal (row) direction.

The horizontal scanning circuit 12 generates a horizontal select signal CH(i) for performing read scanning in the horizontal (row) direction based on the master clock CLK0 supplied from the outside of the solid-state imaging device 1, similarly to the count clock CK0.

FIG. 14 is a timing chart for explaining an operation of the solid-state imaging unit 1 according to the related art shown in FIG. 13.

For example, for the first reading operation, the count value of the counter 254 is first reset to an initial value "0". Then, after the first reading operation of reading pixel signals from unit pixels 3 on an arbitrary row Hx to the vertical signal lines 19 (V0, V1, . . . ) becomes stable, a reference signal RAMP generated by the reference-signal generator 27, temporally changing so as to form substantially ramp waveform, is input, which is compared by the voltage comparator 252 with a pixel signal voltage on an arbitrary vertical signal line 19 (with a column number Vx).

At this time, simultaneously with the input of the reference signal RAMP to the one input terminal RAMP of the voltage comparator 252, in order to measure a comparison time of the voltage comparator 252 by the counter 24, in synchronization with the ramp waveform voltage generated by the reference-signal generator 27 (t10), the counter 24 starts down-counting from the initial value "0" as the first counting operation.

The voltage comparator 252 compares the ram reference signal RAMP from the reference-signal generator 27 with a pixel signal voltage Vx input via a vertical signal line 19. When these voltages become equal, the voltage comparator 252 inverts its output from H level to L level (t12).

Substantially at the same time with the inversion of the output of the voltage comparator 252, the data storage unit 255 latches the count outputs CK1, CK2, . . . CKn from the counter 24 in accordance with a comparison period in the latch 1 of the data storage unit 255 in synchronization with the count clock CK0, whereby the first iteration of AD conversion is completed (t12).

When a predetermined down-count period elapses (t14), the timing controller 21 stops supply of control data to the voltage comparator 252 and supply of the count clock CK0 to the counter 254. Thus, the voltage comparator 252 stops generating the ramp reference signal RAMP.

In the first reading operation, reset components ΔV of the unit pixels 3 are read, and the reset components ΔV includes offset noise that varies among the unit pixels 3. Generally, however, the variation in the reset components ΔV is small, and the reset levels are common among all the pixels, so that the output of an arbitrary vertical signal line 19 (Vx) is substantially known.

Thus, when the reset components ΔV are read in the first reading operation, it is possible to shorten the comparison period by adjusting the reference signal RAMP. According to this related art, the reset components ΔV are compared in a count period corresponding to 7 bits (128 clock cycles).

In the second reading operation, in addition to the reset components ΔV, signal components Vsig corresponding to the amounts of light incident on the respective unit pixels 3 are read, and the operation similar to the first operation is performed.

More specifically, for the second reading operation, the count value of the counter 254 is first reset to the initial value "0". Then, when the second reading operation of reading pixel signals from the unit pixels 3 on an arbitrary row Hx to the vertical signal lines 19 (V0, V1, . . . ) becomes stable, a reference signal RAMP generated by the reference-signal generator 27 so as to temporally change in a stairs-like manner and have substantially ramp waveform is input, and the voltage comparator 252 compares the reference signal RAMP with a pixel signal voltage on an arbitrary vertical signal line 19 (with a column number Vx).

At this time, simultaneously with the input of the reference signal RAMP to the one input terminal RAMP of the voltage comparator 252, in order to measure a comparison time of the voltage comparator 252 using the counter 24, in synchronization with the ramp waveform voltage generated by the reference-signal generator 27 (t20), the counter 24 starts down-counting from the initial value "0" as the second counting operation.

The voltage comparator 252 compares the ramp reference signal RAMP from the reference-signal generator 27 with a pixel signal voltage Vx input via a vertical signal line 19. When these voltages become equal, the voltage comparator 252 inverts its output from H level to L level (t22).

Substantially at the same time as the inversion of the output of the voltage comparator 252, the data storage unit 255 latches the count outputs CK1, CK2, . . . , CKn from the counter 24 in accordance with the comparison period in synchronization with the count clock CK0, whereby the second iteration of AD conversion is completed (t22).

At this time, the data storage unit 255 holds the count value in the first counting operation and the count value in the second counting operation in different places thereof, namely, in the latch 2. In the second reading operation, combinations of the reset components ΔV and the signal components Vsig of the unit pixels 3 are read.

When a predetermined down-count period elapses (t24), the timing controller 21 stops supply of control data to the voltage controller 252 and supply of the count clock CK0 to the counter 254. Thus, the voltage comparator 252 stops generating the ramp reference signal RAMP.

At specific timing (t28) after the second counting operation is completed, the timing controller 21 instructs the horizontal scanning circuit 12 to read pixel data. In response to the instruction, the horizontal scanning circuit 12 sequentially shifts the horizontal select signal CH(i) supplied to the data storage unit 255 via the control line 12c.

Thus, the count value latched in the data storage unit, i.e., pixel data in the first iteration and the second iteration each represented by n-bit digital data is sequentially output to the outside of the column processor 26 via n (2n in total) horizontal signal lines 18 and is input to the subtractor circuit 29 of the output circuit 28.

The n-bit subtractor circuit 29, for each pixel position, subtracts the pixel data of the first iteration, representing the reset component ΔV of a unit pixel 3, from the pixel data of the second iteration, representing the combination of the reset component ΔV and the signal component Vsig of the unit pixel 3, calculating the signal component Vsig of the unit pixel 3.

Then, similar operation is sequentially performed on a row-by-row basis, whereby image signals representing a two-dimensional image are obtained in the output circuit 28.

As will be understood from the above description, however, according to the scheme of AD conversion, in order to obtain digital data representing a true effective signal component, AD conversion must be performed for each of the reset component and the signal component and a difference between the respective count values must be taken. Thus, two iterations of reading and AD conversion are needed. Furthermore, since the count clock CK0, which serves as a reference clock for comparison and AD conversion, is determined by the rate (frequency) of the master clock CLK0 supplied from the outside of the solid-state imaging device 1, the maximum speed of comparison and AD conversion is restricted by the rate (frequency) of the master clock CLK0. Thus, the total period of AD conversion becomes longer, i.e., the processing speed is not sufficient (hereinafter referred to as a first problem).

Furthermore, the horizontal scanning circuit 12 generates the horizontal select signal CH(i) for performing read scanning in the horizontal (row) direction based on the master clock CLK0. Thus, by providing a memory that holds data obtained by AD conversion separately from a memory that holds the result of counting, when AD conversion and reading operation are executed in parallel, i.e., by a pipeline operation, the maximum speed of read scanning in the horizontal (row) direction is restricted by the rate (frequency) of the master clock CLK0 (hereinafter referred to as a second problem).

Furthermore, in the arrangement shown in FIG. 13, the results of the first and second counting operations must be held in the data storage unit 255 that functions as a memory. Thus, two n-bit latches are needed for an n-bit signal (2n latches are needed for each bit), causing an increase in circuit area (hereinafter referred to as a third problem).

Furthermore, lines for inputting the count clock CK0 and n count outputs CK1, CK2, . . . , CKn from the counter 24 to the data storage unit 255 are needed. This could increase noise or power consumption (hereinafter referred to as aa fourth problem).

Furthermore, in order to hold count values of the first and second counting operations at different locations of the data storage unit 255, 2n signal lines for transmitting the results of the first and second counting operations are needed, which causes an increase in the amount of current (hereinafter referred to as a fifth problem).

Furthermore, before a signal is output to the outside of the device, in order to subtract the count value of the first counting operation from the count value of the second counting operation, 2n signal lines for leading the count values to the n-bit subtractor circuit 29 of the output circuit 28 are needed. This could increase noise or power consumption for transferring data (hereinafter referred to as a sixth problem).

That is, a memory for holding the result of the first reading operation and a memory for holding the result of the second reading operation must be individually provided (i.e., two memories are needed) separately from the counter. Furthermore, signal lines for transmitting n-bit count values from the memories to the counter are needed. Furthermore, in order to transfer the n-bit count values of the first and second counting operations to the subtractor, signal for 2n bits (double) are needed. This increases circuitry scale and circuit area, and also increases noise, consumption current, or power consumption.

Furthermore, when AD conversion and reading operation are executed in parallel, i.e., by a pipeline operation, a memory for holding data obtained by AD conversion is needed separately from a memory for holding the result of counting. Similarly to the third problem, two memories are needed for this purpose, causing an increase in circuit area (hereinafter referred to as a seventh problem).

As a measure for overcoming the third problem, in a proposed column AD converter circuit, a correlated double sampling (CDS) function and an AD conversion function are implemented by providing in series a counter that is commonly used among columns, and a CDS processing unit and a latch for holding the count value of the counter, provided for each column. This is described, for example, in YONEMOTO Kazuya, "CCD/CMOS Imeeji sensa no kiso to ouyou", CQ Publishing Co., Ltd., Aug. 10, 2003, First Edition, pp. 201 to 203 (hereinafter referred to as a second non-patent document).

Furthermore, in a proposed scheme for overcoming the fourth problem, for example, an AD conversion function is implemented by providing a counter for each column in the column processor 26. This is described, for example, in IMAMURA Toshifumi and YAMAMOTO Yoshiko, "3. Kousoku kinou CMOS imeeji sensa no kenkyuu", found on the Internet on Mar. 15, 2004 at an URL http://www.sanken.gr.jp/project/iwataPJ/report/h12/h12index. html (hereinafter referred to as a third non-patent document), IMAMURA Toshifumi, YAMAMOTO Yoshiko, and HASEGAWA Naoya, "3. Kousoku kinou CMOS imeeji sensa no kenkyuu", found on the Internet on Mar. 15, 2004 at an URL http://www.sanken.gr.jp/project/iwataPJ/report/h14/h14index. html (hereinafter referred to as a fourth non-patent document), Oh-Bong Kwon et. al., "A Novel Double Slope Analog-to-Digital Converter for a High-Quality 640×480 CMOS Imaging System", VL3-03, 1999, IEEE, pp. 335 to 338 (hereinafter referred to as a fifth non-patent document), and Japanese Unexamined Patent Application Publication No. 11-331883 (hereinafter referred to as a first patent document).

In a column AD circuit described in the second non-patent document, AD converters including counters and latches, which perform parallel processing for the vertical signal lines (columns), converts analog signals into digital signals by taking the difference between a reset component and a signal component while suppressing fixed pattern noise of pixels. Thus, subtraction is not needed, and a single counting operation suffices. Furthermore, memories for holding data obtained by AD conversion can be implemented by latches. This serves to avoid increase in circuit area. That is, the third, fifth, sixth, and seventh problems are overcome.

However, lines for inputting the count clock CK0 and n count outputs from the counters to the latches are needed, so that the fourth problem is not overcome.

According to techniques described in the third and fourth non-patent documents, currents from a plurality of pixels that detect light are simultaneously output onto an output bus, and addition and subtraction are performed in terms of currents on the output bus. Then, signals are converted into pulse-width signals having magnitudes in the temporal direction, and the clock cycles of the pulse widths of the pulse-width signals are counted by counter circuits provided for the respective columns, thereby performing AD conversion. Accordingly, wires for count outputs are not needed, i.e., the fourth problem is overcome.

However, handing of a reset component and a signal component is not described, so that the third, fifth, sixth, and seventh problems are not necessarily overcome. Handling of a reset component and a signal component is not described either in the first and fifth non-patent documents.

On the other hand, the first patent document describes handling of a reset component and a signal component. In order to extract voltage data of a pure image from a reset component and a signal component, for example, by correlated double sampling, digital data of the reset component is subtracted from digital data of the signal component for each column, so that the sixth problem is avoided.

However, according to techniques described in the first patent document, counting is performed in an external system interface to generate a count signal, and a count value at a time when a voltage of the reset component or the signal component matches a reference voltage for comparison is saved in a pair of buffers provided for each column. Thus, the scheme of AD conversion is the same as that in the first non-patent document in that a single counter is commonly used by the columns. Thus, the third to fifth and seventh problems cannot be avoided.

SUMMARY OF THE INVENTION

The present invention has been made in view of the situation described above.

According to an aspect of the present invention, an analog-to-digital conversion method for obtaining digital data of a difference signal component representing a difference between a reference component and a signal component included in an analog signal is provided. A signal corresponding to the reference component or the signal component is compared with a reference signal for conversion into digital data, and concurrently with the comparison, counting is performed in a down-count mode or an up-count mode based on a high-speed counter clock composed of pulses having a frequency that is higher than a frequency of a master clock composed of base pulses corresponding to driving pulses for capturing the analog signal subject to processing, holding a count value at a time of completion of the comparison. The mode of counting is switched according to whether comparison is being performed for the reference component or the signal component.

Regarding the switching of the mode of counting, first, in a first processing iteration, of a reference component and a signal component having different physical properties in a signal subject to processing, output from the same unit element, such as a pixel, a signal corresponding to one of these components is compared with the reference signal for conversion into digital data. Furthermore, concurrently with the comparison, counting is performed in one of the down-count mode and the up-count mode based on the high-speed counter clock, holding a count value at a time of completion of the comparison.

Then, in a second processing iteration, the other one of the reference component and the signal component is compared with the reference signal. Furthermore, concurrently with the comparison, counting is performed in the other one of the down-count mode and the up-count mode, holding a count value at a time of completion of the comparison.

It suffices for the signal component handled in the second processing iteration to be at least indicative of a true signal component in a signal subject to processing. The signal component need not necessarily refer only to a true signal component, and may actually include a noise component or a rest component included in a signal subject to processing.

The reference component and the signal component are relative. That is, it suffices for the difference signal component between the reference component and the signal component to be a component representing the difference between two signal component having different physical properties in a signal subject to processing, output from the same unit element, such as a pixel.

According to another aspect of the present invention, an analog-to-digital converter that is suitable for performing the AD conversion method described above is provided. The analog-to-digital converter includes a comparator that compares a signal corresponding to the reference component and a signal corresponding to the signal component with a reference signal for conversion into digital data; and a counter that performs counting in a down-count mode or an up-count mode concurrently with the comparison in the comparator, based on a high-speed counter clock composed of pulses having a frequency that is higher than a frequency of a master clock composed of base pulses corresponding to driving pulses for capturing the analog signal subject to processing, the counter holding a count value at a time of completion of the comparison in the comparator.

According to another aspect of the present invention, a semiconductor device or an electronic apparatus is provided. The semiconductor device or the electronic apparatus includes the same components as the analog-to-digital converter described above.

When each of the charge generators includes a photoelectric converter element that receives light in the form of electromagnetic wave and that generates charges corresponding to the light received, the semiconductor device can be implemented as a solid-state imaging device.

DESCRIPTION OF THE PREFERRED EMBODIMENTS

Now, embodiments of the present invention will be described in detail with reference to the drawings. The following description will be given in the context of an example where a CMOS imaging device, which is an example of X-Y-addressed solid-state imaging device, is used. It is assumed that all the pixels of the CMOS imaging device are implemented by NMOS transistors.

This, however, is only an example, and the applications of the embodiments are not limited to MOS imaging devices. All the embodiments described below can be applied to any semiconductor device for detecting distribution of physical quantity, including a line or a matrix of unit elements that are sensitive to electromagnetic waves input from the outside, such as light or radiation.

First Embodiment of the Construction of Solid-State Imaging Device

Figure 1:
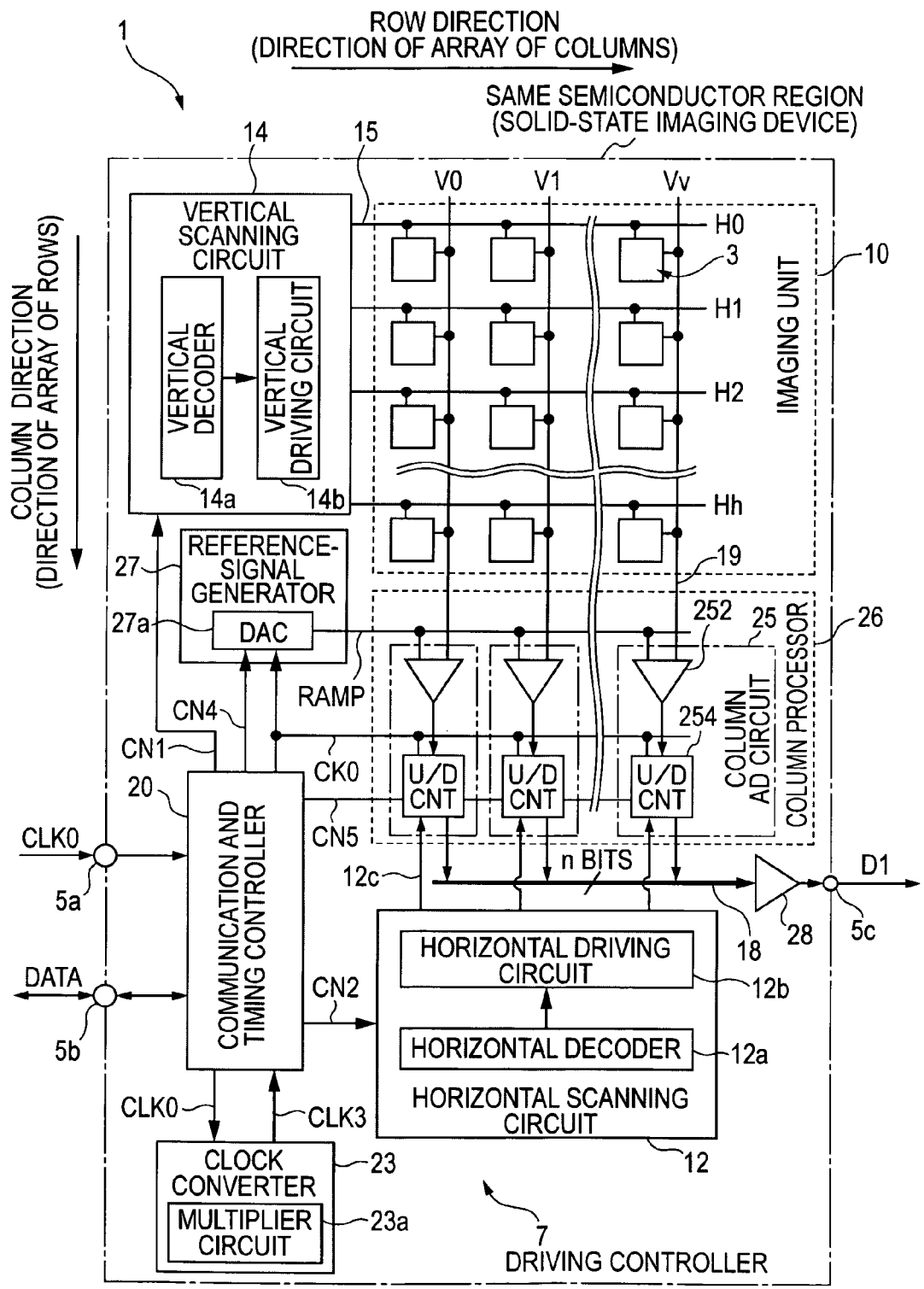
FIG. 1 is a schematic diagram showing the construction of a CMOS solid-state imaging device according to a first embodiment of the present invention.

FIG. 1 is a schematic diagram showing the construction of a CMOS solid-state imaging device (CMOS image sensor), which is a semiconductor device according to a first embodiment of the present invention. The CMOS solid-state imaging device is also an electronic apparatus according to an embodiment of the present invention.

A solid-state imaging device 1 includes a pixel unit in which a plurality of pixels each including a photoreceptor element (which is an example of charge generator) that outputs a voltage signal corresponding to the amount of incident light is arranged in rows and columns (i.e., in a two-dimensional matrix shape). In the solid-state imaging device 1, correlated-double-sampling (CDS) processing units and analog-to-digital converters (ADCs) are provided in association with the respective columns.

By "CDS processing units and ADCs are provided in association with the respective columns", it is meant that a plurality of CDS processing units and ADCs are provided substantially in parallel to vertical signal lines 19 of the columns. The plurality of CDS processing units and ADCS, when viewed in plan, may be both provided on one end of the pixel unit 10 with respect to the column direction (on the output side, i.e., on the lower side as viewed in FIG. 1), or separately provided on one end (on the output side, i.e., on the lower side as viewed in FIG. 1) and on the other end (on the upper side as viewed in FIG. 1) of the pixel unit 10 with respect to the column direction, respectively. In the latter case, preferably, horizontal scanning units that perform horizontal scanning with respect to the horizontal direction are provided separately on both ends so that the horizontal scanning units operate independently of each other.

In a typical example where CDS processing units and ADCs are provided in association with the respective columns, in a region provided on the output side of an imaging unit, referred to as a column region, CDS processing units and ADCs are provided in association with the respective columns, and signals are sequentially read out to the output side. That is, the arrangement is a column-based arrangement. Without limitation to the column-based arrangement, a CDS processing unit and an ADC may be provided in association with each set of (e.g., two) adjacent vertical signal lines 19 (columns), or a CDS processing unit and an ADC may be provided in association with each set of every N-th (N is a positive integer, with (N−1) intervening lines) vertical signal line 19 (column).

According to the above arrangements except for the column-based arrangement, a plurality of vertical signal lines 19 (columns) shares a CDS processing unit and an ADC, so that a switching circuit that supplies pixel signals for a plurality of columns, supplied from the pixel unit 10, to the CDS processing unit and the DAC is provided. Depending on processing that is executed downstream, for example, a memory that holds output signals must be provided.

In any case, by providing a CDS processing unit and an ADC for a plurality of vertical signal lines 19 (columns) so that processing of pixel signals is performed after reading pixel signals on a column-by-column basis, compared with an arrangement in which similar signal processing is performed in individual unit pixels, the construction of each unit pixel is simplified. This allows an image sensor to have an increased number of pixels, to be implemented in a reduced size, and to be manufactured at a lower cost.

Furthermore, it is possible to concurrently process pixel signals of one line by a plurality of signal processors provided in association with the respective columns. This allows the signal processors to operate at a lower speed compared with a case where processing is performed in an output circuit or on the outside of the device by a CDS processing unit and an ADC. This is advantageous in terms of power consumption, bandwidth characteristics, noise, and so forth. In other words, when power consumption and bandwidth characteristics are equalized, high-speed operation of the sensor as a whole is allowed.

In the case of the column-based arrangement, low-speed operation is allowed. This is advantageous in terms of power consumption, bandwidth characteristics, noise, and so forth. Also advantageously, a switching circuit is not needed. The embodiments will be described below in the context of the column-based arrangement unless otherwise specified.

As shown in FIG. 1, the solid-state imaging device 1 according to the first embodiment includes the pixel unit (imaging unit) 10 in which a plurality of unit pixels 3 is arranged in rows and columns, a driving controller 7 provided externally to the pixel unit 10, a column processor 26, a reference-signal generator 27 for supplying a reference voltage for AD conversion to the column processor 26, and an output circuit 28.

As needed, an automatic gain control (AGC) circuit for amplifying signals may be provided upstream or downstream of the column processor 26 in the same semiconductor region where the column processor 26 is provided. When AGC is exercised upstream of the column processor 26, analog amplification is performed. When AGC is exercised downstream of the column processor 26, digital amplification is performed. Since signal levels could be deteriorated when n-bit digital data is simply amplified, preferably, analog amplification is performed before conversion into digital signals.

The driving controller 7 exercises control for sequentially reading signals of the pixel unit 10. For example, the driving controller 7 includes a horizontal scanning circuit (column scanning circuit) 12 that controls column addressing and column scanning, a vertical scanning circuit (row scanning circuit) 14 that controls row addressing and row scanning, and a communication and timing controller 20 that generates an internal clock.

The solid-state imaging device 1 also includes a clock converter 23, which is an example of a high-speed-clock generator, that generates pulses of a clock having a higher frequency than an input clock. A terminal 5a of the solid-state imaging device 1 receives input of a master clock CLK0. The master clock CLK0 has pulses that serve as a base for various driving pulses for capturing analog pixel signals to be processed from the pixel unit 10 to the column processor 26.

The communication and timing controller 20 generates an internal clock based on the input clock (master clock) CLK0 input via the terminal 5a and a high-speed clock generated by a clock converter 23. By using signals originating from the high-speed clock generated by the clock converter 23, AD conversion or output of pixel data to the outside can be executed quickly.

Although some rows and columns are omitted in FIG. 1 for simplicity, actually, several tens to several thousands of unit pixels 3 are arranged on each row and on each column. Each of the unit pixels 3 typically includes a photodiode as a photoreceptor element (charge generator), and an intra-pixel amp having an amplifying semiconductor device (e.g., a transistor).

The intra-pixel amp is implemented, for example, by a floating-diffusion amp. For example, an amp including four transistors in relation to the charge generator, namely, a read-select transistor, which is an example of a charge reader (transferring gate/reading gate), a reset transistor, which is an example of a reset gate, a vertical-select transistor, and a source-follower amplifying transistor, which is an example of a detector that detects change in the potential of floating diffusion, may be used. This arrangement is typical in a CMOS sensor.

Alternatively, as described in Japanese Patent No. 2708455, an arrangement including three transistors may be used, namely, an amplifying transistor for amplifying a signal voltage corresponding to signal charges generated by the charge generator, connected to a drain line (DRN), a reset transistor for resetting the charge generator, and a read-select transistor (transferring gate) that is scanned by a vertical shift register via a transferring line (TRF).

As other components of the driving controller 7, the horizontal scanning circuit 12, the vertical scanning circuit 14, and the communication and timing controller 20 are provided. The horizontal scanning circuit 12 functions as a reading scanner that reads a count value from the column processor 26. The components of the driving controller 7 are formed together with the pixel unit 10 in a semiconductor region of single-crystal silicon or the like using techniques used to manufacture semiconductor integrated circuits, forming a solid-state imaging device, which is an example of a semiconductor system.

The unit pixels 3 are connected to the vertical scanning circuit 14 via row control lines 15 for row selection, and are connected via the vertical signal lines 19 to the column processor 26 in which the column AD circuits 25 are provided for the respective columns. The row control lines 15 generally refer to lines running from the vertical scanning circuit 14 into pixels.

The horizontal scanning circuit 12 and the vertical scanning circuit 14 respectively include decoders, so that shift operations (scanning) are started in response to control signals CN1 and CN2 supplied from the communication and timing controller 20. Thus, the row control lines 15 include lines for transferring various pulse signals for driving the unit pixels 3 (e.g., a reset pulse RST, a transfer pulse TRF, and a DRN control pulse DRN).

Although not shown, the communication and timing controller 20 includes a functional block corresponding to a timing generator (an example of read-address controller) that supplies clocks needed for the operation of the components and pulse signals at specific timings, and a functional block corresponding to a communication interface that receives a master clock CLK0 via a terminal 5a, that receives data DATA instructing an operation mode or the like via a terminal 5b, and that outputs data including information of the solid-state imaging device 1. For example, the communication and timing controller 20 outputs a horizontal address signal to a horizontal decoder 12a and a vertical address signal to a vertical decoder 14a so that the respective decoders 12a and 14a select corresponding row and column.

Since the unit pixels 3 are arranged in a two-dimensional matrix shape, analog pixel signals that are generated by the pixel-signal generators 5 and output in the column direction via the vertical signal lines are accessed and captured on a row-by-row basis (in a column-parallel manner), i.e., vertical-scan reading is performed. Then, access in the row direction, i.e., the direction of array of the columns, is performed to read pixel signals (digitized pixel data in this embodiment) to the output side, i.e., horizontal-scan reading is performed. This serves to improve the speed of reading pixel signals or pixel data. Obviously, without limitation to scan reading, only information of unit pixels 3 needed may be read by random access, i.e., by directly specifying addresses of unit pixels 3 to be read.

Furthermore, in this embodiment, the communication and timing controller 20 supplies a clock CLK1 having the same frequency as the master clock CLK0 input via the terminal 5a, a clock having a half frequency, or a low-speed clock having a further divided frequency to the components in the device, e.g., the horizontal scanning circuit 12, the vertical scanning circuit 14, or the column processor 26. Hereinafter, the clock having the half frequency, and clocks having even lower frequencies in general, will be referred to as low-speed clocks CLK2.

The vertical scanning circuit 14 selects a row of the pixel unit 10 and supplies pulses needed for the row. For example, the vertical scanning circuit 14 includes the vertical decoder 14a for defining a row to be read in the vertical direction (i.e., for selecting a row of the pixel unit 10), and a vertical driving circuit 14 for driving the row control lines 15 for the unit pixels 3 on a read row address defined by the vertical decoder 14a by supplying pulses thereto. In addition to a row for reading signals, the vertical decoder 14a also selects a row for electronic shutter or the like.

The horizontal scanning circuit 12, in synchronization with the low-speed clocks CLK2, sequentially selects the column AD circuits 25 of the column processor 26 under the control according to the high-speed clock supplied from the clock converter 23, leading signals of the column AD circuits 25 to the horizontal signal lines (horizontal output lines) 18. For example, the horizontal scanning circuit 12 includes the horizontal decoder 12a for defining a column to be read in the horizontal direction (for selecting the individual column AD circuits 25 in the column processor 26), and a horizontal driving circuit 12b for leading signals of the column processor 26 to the horizontal signal lines 18 according to a read address defined by the horizontal decoder 12a. The number of horizontal signal lines 18 corresponds to the number n (n is a positive integer) of bits of signals handled by the column AD circuits 25. For example, if n is ten, ten horizontal signal lines 18 are provided correspondingly to the number n of bits.

In this embodiment, the horizontal scanning circuit 12 operates in synchronization with the low-speed clocks CLK2. Since the horizontal scanning circuit 12 is controlled according to signals that are generated based on high-speed clocks (e.g., multiplied clocks) supplied from the clock converter 23, so that the horizontal scanning circuit 12 operates more quickly than in a case where it is controlled according to the master clock CLK0 that is input from outside via the terminal 5a.

Clock Converter

The clock converter 23 includes a multiplier circuit 23a that generates pulses having a clock frequency that is faster than an input clock frequency. The clock converter 23 receives a low-speed clock CLK2 from the communication and timing controller 20, and generates therefrom a clock having a frequency that is twice as high or even higher. Hereinafter, clocks having frequencies that are twice as high as or even higher than the low-speed clock CLK2 will be generally referred to as high-speed clocks. In this example, the high-speed clock generated will be referred to as a high-speed clock CLK3. The clock converter 23 supplies the low-speed clock CLK2 received from the communication and timing controller 20 or the high-speed clock CLK 3 it generated to the communication and timing controller 20 or to the output circuit 28, which is an example of data output unit.

The communication and timing controller 20, based on the high-speed clock CLK3 that is faster than the master clock CLK0, generates a reference clock (the same as CK0 in this example) for generating a reference signal (reference voltage) RAMP for AD conversion, or a counter clock CK0 (e.g., having the same frequency as CLK3). Although the high-speed clock CLK3 has a frequency that is twice as high as or even higher than the low-speed clock CLK2 in this example, the frequency of the high-speed clock CLK3 need not necessarily be an integer multiple of the frequency of the low-speed clock CLK2. However, an integer multiple is preferred for the ease of continuation of data.

By using signals originating from the high-speed clock generated from the clock converter 23, operation such as AD conversion can be executed quickly. Furthermore, motion extraction or compression that requires high-speed calculation can be executed using the high-speed clock. Furthermore, it is possible to serialize parallel data output from the column processor 26 and to output serial video data D1 to the outside of the device. Thus, the arrangement allows output at a high speed with a number of terminals smaller than the number of bits of data obtained by AD conversion.

Preferably, the frequency of the high-speed clock CLK3 can be changed by an external command via the communication and timing controller 20 that allows communications with the outside. In that case, preferably, a frequency switching command P3 can be automatically switched according to operation mode, such as still-picture capturing mode, moving-picture capturing mode, or summation reading mode. For example, when the communication and timing controller 20 receives an instruction of operation mode from a central controller external to the device and issues a frequency switching command P3 in accordance with the operation mode to the clock converter 23, the frequency of the high-speed clock CLK3 generated by the clock converter 23 is switched.

Alternatively, by notifying the clock converter 23 of the frequency switching command P3 issued by the central controller external to the device, independently of the operation mode (substantially directly), the frequency of the high-speed clock CLK3 may be switched automatically according to the notification. Even in that case, according to the construction of the embodiment, since the communication and timing controller 20 has the function of communicating with the outside, the clock converter 23 is notified of the frequency switching command P3 via the communication and timing controller 20. Without limitation to the construction described above, however, by providing the clock converter 23 a function of communicating with the outside, the clock converter 23 may directly communicate with the outside.

The clock converter 23 may be provided in a timing generator (TG) (not shown) in the communication and timing controller 20. In that case, however, the clock converter 23 and lines extending therefrom and carrying the high-speed clock CLK3 cause noise. Thus, preferably, the clock converter 23, the column processor 26, and the output unit 28, designed individually, are disposed adjacently in proximity to the output side of the device.

More preferably, the clock converter 23, the column processor 26, and the output circuit 28 are integrated as a single block provided on the output side. For example, the clock converter 23, the column processor 26, and the output circuit 28 are formed in such a complex manner that the edges of the individual components cannot be defined. By providing these components in substantially integrated manner, lines for transferring closely related signals can be disposed at minimum distances among the components.

The multiplier circuit 23a of the clock converter is a k1 multiplier circuit, where k1 denotes a multiplier of the frequency of the low-speed clock CLK2, and can be implemented using various known circuits. For example, circuit technologies of phase locked loop (PLL) frequency synthesizers may be used, as described in the related art section of Japanese Unexamined Patent Application Publication No. 2003-8435 or paragraphs 6 and 7 and FIG. 10 of Japanese Patent Publication No. 3360667. By using PLL technologies, it is possible to cause the high-speed clock CLK3 to be phase locked with the low-speed clock CLK2. Without limitation to PLL technologies, circuit technologies described, for example, in Japanese Patent No. 3366223 may be used.

Furthermore, as described in "Shuuhasuu teibaikairo-no setsumei" found online on the Internet at an URL of http://www.nakaco.co.jp/technical/Freqmultiplier.pdf, Jun. 20, 2003, circuit technologies for using bandpass filters for repeated amplification may be used. According to the technologies, based on a low-speed clock CLK2 that serves as a source of oscillation, all frequencies up to a multiplied high-speed clock CLK3 can be covered. Furthermore, compared with a case where the frequency is multiplied by a PLL circuit, noise is reduced, so that a relatively noise-free high-frequency clock can be obtained.

In the solid-state imaging device 1 constructed as described above, pixel signals output from the unit pixels 3 are supplied to the column AD circuits 25 of the column processor 26 via the vertical signal lines 19 on a column-by-column basis.

Each of the column AD circuits 25 of the column processor 26 sequentially receives signals of pixels of one line and processes the signals. For example, each of the column AD circuits 25 includes an analog-to-digital converter (ADC) that converts analog signals into, for example, 10-bit digital data based on the high-speed clock CLK3.

Although the construction of the ADC will be described later in detail, counting based on clock signals is started when a ramped reference signal RAMP is supplied to a voltage comparator, and analog pixel signals input via the vertical signal lines 19 are compared with the reference signal RAMP to carry out counting until pulse signals are obtained, whereby AD conversion is performed.

At this time, by suitably configuring the circuit, together with AD conversion, with regard to voltage-mode pixel signals input via the vertical signal lines 19, the difference between a signal level immediately before the pixel is reset (noise level) and a true signal level Vsig in accordance with the amount of light received can be calculated. Thus, it is possible to remove a noise component called fixed pattern noise (FPN) or reset noise.

Pixel data digitized by the column AD circuits 25 is transferred to the horizontal signal lines 18 via a horizontal selecting switch (not shown) that is driven according to horizontal select signals supplied from the horizontal scanning circuit 12, and is then input to the output circuit 28. The number of bits is not limited to 10, and may be less than 10 (e.g., 8) or greater than 10 (e.g., 14).

According to the construction described above, the pixel unit 10 including a matrix of photoreceptor elements that act as charge generators sequentially outputs pixel signals for respective columns on a line-by-line basis. Then, a frame image, i.e., an image corresponding to the matrix of photoreceptors in the pixel unit 10, is presented as a set of pixel signals for the entire pixel unit 10.

Details of Column AD Circuits and Reference-Signal Generator

The reference-signal generator 27 includes a digital-to-analog converter (DAC) 27. The reference-signal generator 27 generates stairs-like ramp waveform from an initial value, indicated as control data CN4 from the communication and timing controller 20, in synchronization with a count clock CK0, and supplies the ramp waveform as a reference voltage for AD conversion (ADC reference signal) to the individual column AD circuits 25 of the column processor 26. Although not shown, preferably, a filter for removing noise is provided.

The sawtooth-shaped stairs-like wave is generated using a high-speed clock supplied from the clock converter 23, e.g., the count clock CK0, which is based on a multiplied clock generated by the multiplier circuit 23*a*. Thus, the sawtooth-shaped stairs-like wave changes rapidly compared with a case where the wave is generated based on the master clock CLK0 input via the terminal 5*a*.

The control data CN4 supplied from the communication and timing controller 20 to the DAC 27*a* of the reference-signal generator 27 includes information that causes the ratio of change in digital data with respect to time to be constant so that the ramp voltage has the same gradient (ratio of change) on each comparing operation. Preferably, for example, the count value is changed by 1 in each unit time defined by the count clock CK0.

Each of the column AD circuits 25 includes a voltage comparator 252 that compares the reference signal RAMP generated by the DAC 27*a* of the reference-signal generator 27 with analog pixel signals obtained from the unit pixels 3 via the vertical signal lines 19 (V0, V1, . . . ) for each of the row control lines 15 (H0, H1, . . . ), and a counter 254 that counts time for completion of comparing operations of the voltage comparator 252 and holding the result. Thus, the column AD circuit 25 has a function of n-bit AD conversion.

The communication and timing controller 20 functions as a controller that switches the mode of counting by the counter 254 according to whether a reset component ΔV or a signal component Vsig of a pixel signal the voltage comparator 252 is executing a comparing operation for. A control signal CN5 for instructing whether the counter 254 is to operate in down-count mode or up-count mode is input from the communication and timing controller 20 to the counter 254 of each of the column AD circuits 25.

One input terminal RAMP of the voltage comparator 252 receives input of the stairs-like reference signal RAMP generated by the reference-signal generator 27, commonly with the input terminals RAMP of the other voltage comparators 252. The other input terminals of the voltage comparators 252 are respectively connected to the vertical signal lines 19 of the associated columns so that pixel signals can be individually input from the pixel unit 10. Signals output from the voltage comparator 252 are supplied to the counters 254.

To a clock terminal CK of the counter 254, a count clock CK0 is input from the communication and timing controller 20, commonly with the clock terminals CK of the other counters 254.

The counter 254 performs counting based on the count clock CK0 and an output of the voltage comparator 252.

Figure 13:
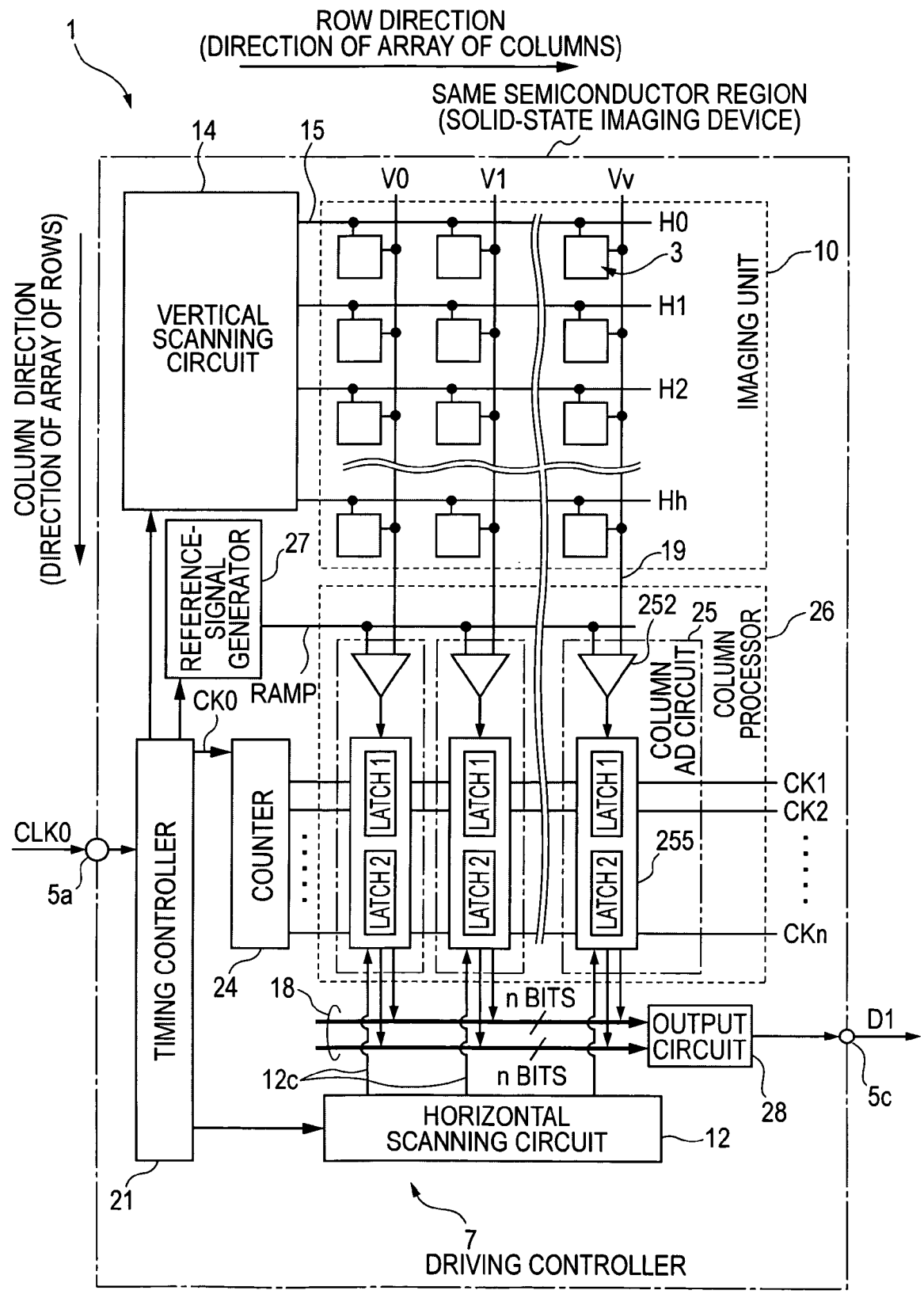
FIG. 13 is a schematic diagram showing a CMOS solid-state imaging device according to the related art, in which an AD converter and a pixel unit are mounted on the same semiconductor substrate.
Figure 14:
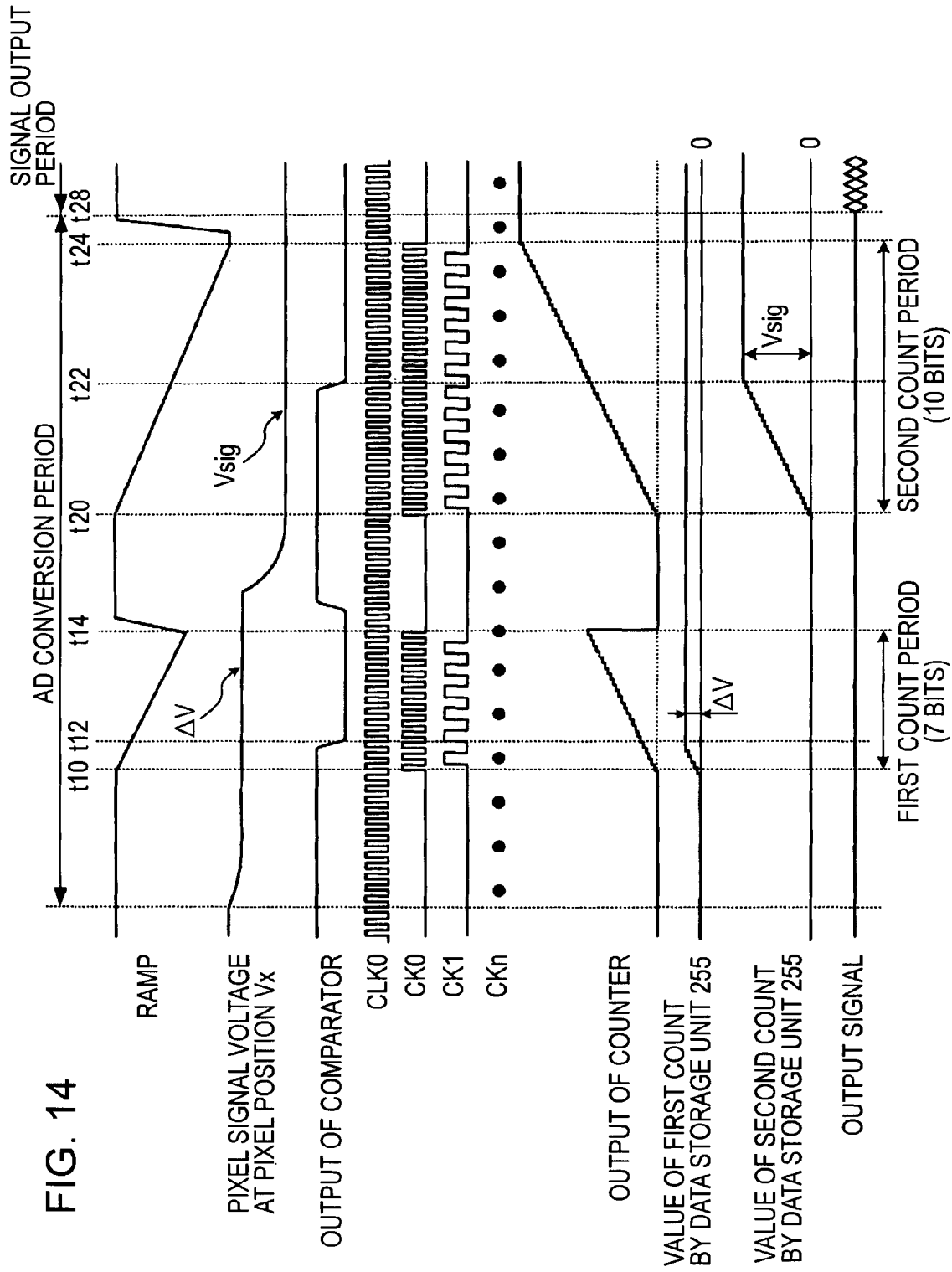
FIG. 14 is a timing chart for explaining an operation of the solid-state imaging device according to the related art shown in FIG. 13.

Although the construction of the counter 254 is not shown, the counter 254 can be implemented by changing the wiring of the data storage unit 255 formed by latches, shown in FIG. 13, into wiring for synchronous counter, and the counter 254 internally performs counting based on input of a single count clock CK0. The count clock CK0, similarly to the stairs-like voltage waveform, is generated based on a high-speed clock (e.g., a multiplied clock) supplied from the clock converter 23, so that counting is performed more quickly than in a case where a count clock is generated based on the master clock CLK0 input via the terminal 5*a*.

The n-bit counter 254 can be implemented by a combination of n latches, so that the circuitry scale is reduced to half compared with the data storage unit 255 formed by two lines of n latches. Furthermore, the counter 24 is not needed, so that the overall size becomes considerably compact compared with the arrangement shown in FIG. 13.

As will be described later in detail, the counter 254 in the first embodiment uses a common up/down counter (U/D CNT) irrespective of counting mode, and is capable of switching between down-counting operation and up-counting operation (i.e., alternately). Furthermore, the counter 254 in the first embodiment uses a synchronous counter that outputs a count value in synchronization with the count clock CK0.

In the case of a synchronous counter, operations of all flip-flops (elements of the counter) are restricted by the count clock CK0. Thus, when operation at a higher frequency is needed, preferably, an asynchronous counter, which is suitable for high-speed operation since the operation limit frequency thereof is determined only by the limiting frequency of the first flip-flop (element of the counter), is used.

The counter 254 receives control pulses from the horizontal scanning circuit 12 via the control line 12c. The counter 254 has a latch function for holding the result of counting, and it holds a count output value until an instruction by control pulses is received via the control line 12c.

As described earlier, the column AD circuits 25 constructed as described above are provided for the respective vertical signal lines 19 (V0, V1, . . . ), forming the column processor 26, which is a column-parallel ADC block.

The outputs of the individual column AD circuits 25 are connected to the horizontal signal lines 18. As described earlier, the horizontal signal lines 18 includes n-bit signal lines corresponding to the bit width of the column AD circuits 25. The horizontal signal lines 18 are connected to the output circuit 28 via n sensing circuits (not shown) associated with the respective output lines.

In the construction described above, the column AD circuits 25 performs counting in a pixel-signal reading period, outputting the result of counting at specific timing. That is, first, the voltage comparator 252 compares the ramp waveform voltage supplied from the reference-signal generator 27 with the pixel-signal voltage input via the vertical signal line 19. When these voltages are equal, the output of the voltage comparator 252 is inverted (changes from H level to L level in this embodiment).

The counter 254 starts counting in down-count mode or up-count mode in synchronization with the ram waveform voltage generated by the reference-signal generator 27. When the counter 254 is notified of the inversion of the output of the comparator 252, the counter 254 stops counting, and latches a current count value as pixel data, whereby AD conversion is completed.

Then, the counter 254, by shift operations according to horizontal select signals CH(i) input via the control line 12c from the horizontal scanning circuit 12 at specific timing, outputs pixel data stored sequentially to the outside of the column processor 26 or to the outside of the chip of the pixel unit 10 via the output terminal 5c.

The solid-state imaging device 1 may include other various signal processing circuits, although such circuits are not shown since they are not directly relevant to the description of the embodiment.

First Embodiment of the Operation of the Solid-State Imaging Device

Figure 2:
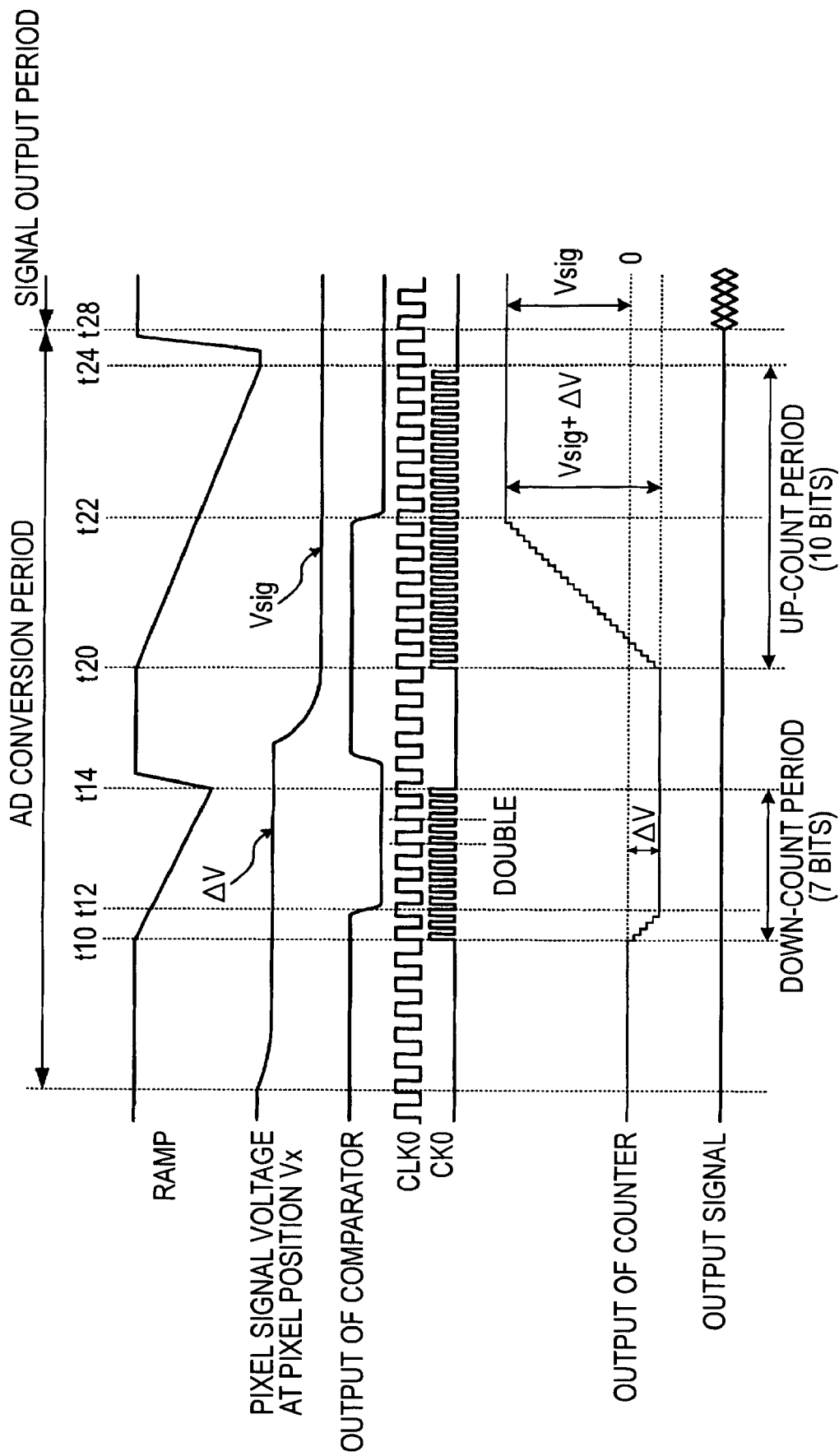
FIG. 2 is a timing chart for explaining an operation of a column AD circuit of the solid-state imaging device according to the first embodiment shown in FIG. 1.

FIG. 2 is a diagram for explaining an operation of the column AD circuits 25 in the solid-state imaging device 1 according to the first embodiment shown in FIG. 1. As a mechanism for converting analog pixel signals sensed by the unit pixels 3 of the pixel unit 10 into digital signals, for example, a point where the ramp-waveform reference signal RAMP that decreases at a specific gradient matches the voltage of a reference component or signal component in pixel signals from the unit pixels 3. Then, counting is performed based on a count clock between the time when the reference signal RAMP used for comparison is generated and the time when the signal corresponding to a reference component or signal component in pixel signals matches the reference signal, whereby a count value corresponding to the magnitude of the reference component or signal component is obtained.

In a pixel signal output from the vertical signal line 19, a signal component Vsig appears after a reset component ΔV that serves as a reference component, including noise of the pixel signal. When the first iteration is performed for the reference component (reset component ΔV), the second iteration is performed for a signal including the signal component Vsig in addition to the reference component (reset component ΔV). Now, the operation will be described more specifically.

For the first iteration of reading, the communication and timing controller 20 resets the count value of the counter 254 to an initial value of "0", and causes the counter 254 to enter down-count mode. When the first iteration of reading from unit pixels 3 on an arbitrary row Hx to the vertical signal lines 19 (V0, V1, . . . ) becomes stable, the communication and timing controller 20 supplies control data CN4 for generating the reference signal RAMP to the reference-signal generator 27.

In response to the control data CN4, the reference-signal generator 27 inputs ramp waveform that temporally changes in a ramp-like manner as a comparison voltage to one input terminal RAMP of the voltage comparator 252. The voltage comparator 252 compares the RAMP waveform comparison voltage with a pixel signal voltage of a vertical signal line 19 (Vx) supplied from the pixel unit 10. The ramp waveform is generated based on a high-speed clock (e.g., multiplied clock) supplied from the clock converter 23, so that it is faster than the master clock CLK0 input from the outside. In this embodiment, the ramp waveform is twice as fast as the master clock CLK0, as shown in FIG. 2.

Simultaneously with the input of the reference signal RAMP to the input terminal RAMP of the voltage comparator 252, in order to measure a time of comparison by the voltage comparator 252 by the counter 254 provided for each row, in synchronization with the ramp waveform voltage generated by the reference-signal generator 27 (t10), a count clock CK0 is input from the communication and timing controller 20 to the clock terminal of the counter 254, and down-counting is started from an initial value of "0" as the first counting operation. That is, counting is started toward the negative direction.

Similarly to the ramp waveform, the count clock CK0 is also generated based on a high-speed clock (e.g., multiplied clock) supplied from the clock converter 23, so that it faster than the master clock CLK0 input from the outside. In this embodiment, the count clock CK0 is twice as fast as the master clock CLK0.

The voltage comparator 252 compares the ramp reference signal RAMP supplied from the reference-signal generator 27 with the pixel signal voltage Vx input via the vertical signal line 19, and inverts its output from H level to L level when these voltages become equal (t12). That is, the voltage comparator 252 compares a voltage signal corresponding to a reset component Vrst with the reference signal RAMP, and generates an active-low (L) pulse signal after a time corresponding to the magnitude of the reset component Vrst elapses, outputting the pulse signal to the counter 254.

In response to the pulse signal, the counter 254 stops counting substantially at the same time as the inversion of the output of the voltage comparator 252, and latches a current count value as pixel data, whereby AD conversion is completed (t12). That is, the counter 254 starts down-counting at the time of generation of the ramp reference signal RAMP supplied to the voltage comparator 252, and continues counting based on the clock CK0 until an active-low (L) pulse signal is obtained by comparison, thereby obtaining a count value corresponding to the magnitude of the reset component Vrst.

The communication and timing controller 20, when a predetermined down-counting period elapses (t14), stops supply of control data to the voltage comparator 252 and supply of the count clock CK0 to the counter 254. Thus, the voltage comparator 252 stops generating the ramp reference signal RAMP.

In the first iteration of reading, counting is performed by detecting the reset level Vrst in the pixel signal voltage Vx by the voltage comparator, i.e., the reset component $\Delta V$ of a unit pixel 3 is read.

In the reset component $\Delta V$, noise that varies among the unit pixels 3 is included as offset. Generally, however, variation of the reset component $\Delta V$ is small, and the reset level Vrst is substantially the same for all the pixels, so that the output value of the reset component $\Delta V$ on an arbitrary vertical signal line 19 is substantially known.

Thus, in the first operation of reading the reset component $\Delta V$, it is possible to shorten the down-count period (comparison period t10 to t14) by adjusting the ramp voltage. In this embodiment, the maximum period of comparison for the reset component $\Delta V$ is a count period corresponding to 7 bits (128 clock cycles). In this embodiment, the counting is performed twice as fast as the master clock CLK0 input from the outside. Thus, comparison for the reset component $\Delta V$ is performed in 64 clock cycles of the master clock CLK0.

In the second reading operation, in addition to the reset component $\Delta V$, a signal component Vsig corresponding to the amount of incident light for each unit pixel 3 is read, and the same operation as the first reading operation is performed. That is, the communication and timing controller 20 first causes the counter 254 to enter up-counting mode. Then, when the second operation of reading from unit pixels 3 of an arbitrary line Hx to the vertical signal lines 19 (V0, V1, . . . ) becomes stable, the communication and timing controller 20 supplies control data CN4 for generating the reference-signal RAMP to the reference-signal generator 27.

In response to the control data CN4, the reference-signal generator 27 inputs a ramp waveform that temporally changes in a ramp-like manner as a comparison voltage to the one input terminal RAMP of the voltage comparator 252. The voltage comparator 252 compares the ramp waveform comparison voltage with a pixel signal voltage of an arbitrary vertical signal line 19 (Vx) supplied from the pixel unit 10.

Similarly to the first reading operation, the ramp waveform is generated based on a high-speed clock (e.g., multiplied clock) supplied from the clock converter 23, so that it is faster than the master clock CLK0 input from the outside. In this embodiment, the ramp waveform is twice as fast as the master clock CLK0, as shown in FIG. 2.

Simultaneously with the input of the reference signal RAMP to the input terminal RAMP of the voltage comparator 252, in order to measure a comparison time of the voltage comparator 252 by the counter 254 provided for each row, in synchronization with the ramp waveform voltage generated by the reference-signal generator 27 (t20), the communication and timing controller 20 inputs a count clock CK0 to the clock terminal of the counter 254. Then, as the second counting operation, as opposed to the first counting operation, up-counting is started from a count value corresponding to the reset component $\Delta V$ of the unit pixel 3 obtained in the first reading operation. That is, counting is started in the positive direction.

Similarly to the count clock CK0 for down-counting in the first reading operation or the ramp waveform, the count clock CK0 for up-counting is also generated from a high-speed clock (e.g., multiplied by an integer) supplied from the clock converter 23, so that it is faster than the master clock CLK0 input from the outside. In this embodiment, as shown in FIG. 2, the count clock CK0 is twice as fast as the master clock CLK0.

The voltage comparator 252 compares a pixel signal voltage Vx input via a vertical signal line 19 with the ramp reference signal RAMP supplied from the reference-signal generator 27. When these voltages become equal, the voltage comparator 252 inverts its output from H level to L level (t22). That is, the voltage comparator 252 compares a voltage signal corresponding to the signal component Vsig with the reference signal RAMP, generates an active-low (L) pulse signal after a time corresponding to the magnitude of the signal component Vsig elapses, and supplies the pulse signal to the counter 254.

Substantially at the same time with the inversion of the output of the voltage comparator 252, the counter 254 stops counting and latches a current count value as pixel data, whereby AD conversion is finished (t22). That is, the counter 254 starts down-counting when generation of the ramp reference signal RAMP supplied to the voltage comparator 252 is started, and continues counting based on the clock CK0 until an active-low (L) pulse signal is obtained by comparison, thereby obtaining a count value corresponding to the magnitude of the signal component Vsig.

The communication and timing controller 20, when a predetermined down-counting period elapses (t24), stops supply of control data to the voltage comparator 252 and supply of the count clock CK0 to the counter 254. Thus, the voltage comparator 252 stops generating the ramp reference signal RAMP.

In the second reading operation, counting is performed while detecting the signal component Vsig of the pixel signal voltage Vx by the voltage comparator 252, so that the signal component Vsig of the unit pixel 3 is read.

In this embodiment, the counter 254 performs down-counting in the first reading operation and up-counting in the second reading operation. Thus, the counter 254 automatically performs subtraction according to expression (1) below, holding a count value in accordance with the result of subtraction.

(Count value in the second comparison period)−
(Count value in the first comparison period)    (1)

Expression (1) can be rearranged as expression (2), so that the count value held by the counter 254 corresponds to the signal component Vsig.

(Second comparison period)−(First comparison
period)=(Signal component Vsig+reset component $\Delta V$+offset component of column AD circuit 25)−(reset component $\Delta V$+offset component of column AD circuit 25)=(Signal component Vsig)

That is, as described above, by the subtraction in the counter 254 through the two reading and counting operations, i.e., down-counting in the first reading operation and up-counting in the second reading operation, the reset component ΔV including variation for each unit pixel 3 and the offset component for each column AD circuit 25 can be removed. Thus, only the signal component Vsig corresponding to the amount of incident light for each unit pixel 3 can be extracted by a simple configuration. At this time, advantageously, reset noise can also be removed.

Thus, the column AD circuit 25 in this embodiment operates as a correlated double sampling (CDS) processing unit as well as an AD converter that converts analog pixel signals into digital pixel data.

Furthermore, since pixel data represented by the count value according to expression (2) represents a positive signal voltage, complement operation is not needed, so that compatibility with existing systems is high.

In the second reading operation, the signal component Vsig corresponding to the amount of incident light is read. Thus, in order to allow determining the amount of light in a large range, a long up-counting period (t20 to t24, comparison) period must be provided, considerably changing the ramp voltage supplied to the voltage comparator 252.

Thus, in this embodiment, the maximum period of comparison for the signal component Vsig is chosen to be a count period corresponding to 10 bits (1024 clock cycles). That is, the maximum period of comparison for the reset component ΔV (reference component) is chosen to be shorter than that for the signal component Vsig.

Instead of choosing the same maximum period of comparison, i.e., maximum period of AD conversion, for the reset component ΔV (reference component) and the signal component Vsig, the maximum period of comparison for the reset component ΔV (reference component) is chosen to be shorter than that for the signal component Vsig, so that the total AD conversion period over the two iterations becomes shorter.

Similarly to the first iteration, since counting is performed faster than the master clock CLK0 input from the outside, comparison for the signal component Vsig is performed in 512 clock cycles of the master clock CLK0.

In this case, the number of bits of comparison differs between the first iteration and the second iteration. However, by supplying control data from the communication and timing controller 20 to the reference-signal generator 27 and causing the reference-signal generator 27 to generate the ramp voltage based on the control data, the gradient of the ramp voltage, i.e., the rate of change in the reference signal RAMP, is maintained the same between the first iteration and the second iteration. Since the ramp voltage is generated by digital control, it is easy to maintain the same gradient of ramp voltage between the first iteration and the second iteration. Thus, it is possible to equalize the precision of AD conversion, so that a correct result of subtraction according to expression (1) is obtained by the up/down counter.

At a specific timing (t28) after the second counting operation is finished, the communication and timing controller 20 instructs the horizontal scanning circuit 12 to read pixel data. In response to the instruction, the horizontal scanning circuit 12 sequentially shifts the horizontal select signal CH(i) supplied to the counter 254 via the control line 12c.

Accordingly, the count value according to expression (2), held by the counter 254, i.e., pixel data represented by n-bit digital data, is sequentially output from the output terminal 5c to the outside of the column processor 26 or to the outside of the chip including the pixel unit 10 via the n horizontal signal lines 18. Then, similar operation is repeated for each row, whereby video data D1 representing a two-dimensional image is obtained.

Since the horizontal scanning circuit 12 is also controlled according to a signal generated from a high-speed clock (e.g., multiplied by an integer) supplied from the clock converter 23, the operation is faster than in a case where the horizontal scanning circuit 12 is controlled according to the master clock CLK0 input from the outside. In this embodiment, the horizontal scanning circuit 12 is controlled so as to operate at a speed twice as fast as the master clock CLK0, so that advantageously, an image can be generated at a doubled speed.

Furthermore, in this embodiment, the reference-signal generator 27 that generates a ramp waveform, the column AD circuit 25 that performs up-counting or down-counting, and the horizontal scanning circuit 12 are controlled so as to operate twice as fast as the master clock CLK0 according to a signal generated from a high-speed clock (e.g., multiplied by an integer) supplied from the clock converter 23. However, the ratio (e.g., an integer) of increasing speed relative to the master clock CLK0 may be set as desired by data DATA via the terminal 5b. Operation at a further speed is possible by increasing the ratio (e.g., an integer) of increasing speed.

The multiplication factor of the count clock CK0 serving as a reference for the control data CN4 for controlling the reference signal RAMP for AD conversion and as a reference for counting in the counter 254 can be set independently of the multiplication ratio for the control signal CN2 for controlling the horizontal scanning circuit 12.

Thus, when high-speed output is not particularly needed, the horizontal scanning circuit 12 may be controlled according to a signal generated from the master clock CLK0 input from the outside. Even in that case, the count clock CK0 serving as a reference for the reference signal RAMP for AD conversion and as a reference for counting in the counter 254 can be controlled by an arbitrary multiplication factor so that the total AD conversion period involving two reading operations and AD conversion can be shortened.

On the other hand, when high-speed output is needed, maximum multiplication factors are set for the horizontal scanning circuit 12, the reference signal RAMP for AD conversion, and the counter 254, so that operation at a maximum speed is allowed.

As described above, according to the solid-state imaging device of the first embodiment, two counting operations are performed using an up/down counter while switching processing mode of the up/down counter. Furthermore, in an arrangement including a matrix of unit pixels 3, column-parallel AD circuits are provided, i.e., column AD circuits 25 are provided for the respective columns.

Thus, it is possible to directly subtract a reference component (reset component) from a signal component for each column as a result of the second counting operation. Thus, memories for holding the results of counting associated with the reference component and the signal component can be implemented by a latch function of the counter. Therefore, special memories for holding data obtained by AD conversion need not be provided separately from the counter.

Furthermore, a special subtractor for subtracting the reference component from the signal component is not needed. Thus, compared with the related art, circuitry scale or circuit area can be reduced. Furthermore, increase in noise, increase in current, or increase in power consumption can be avoided.

Furthermore, since the column AD circuit includes a comparator and a counter, irrespective of the number of bits, counting can be controlled by a single count clock for the operation of the counter and a control line for switching count mode. Thus, signal lines for leading count values of counters to memories, needed in the related art, are not needed. This serves to avoid increase in noise or increase in power consumption.

That is, in the solid-state imaging device 1 having an AD converter on the same chip, a column AD circuit 25 that acts as an AD converter is implemented by a pair of the voltage comparator 252 and the counter 254, the counter 254 performs down-counting and up-counting in combination, and the difference between a basic component (reset component in this embodiment) and a signal component of a signal subject to processing is converted into digital data. This serves to avoid problems relating to circuitry scale, circuit area, power consumption, the number of wires for interfacing with other functional units, or noise or consumption current associated with the wires.

Furthermore, since AD conversion is performed by performing comparison and counting using signals based on a high-speed clock generated by the clock converter 23, even when a difference signal component between the reference component and the signal component is converted into digital data by performing AD conversion in two iterations, AD conversion as a whole can be executed quickly, and the AD conversion period can be shortened.

Second Embodiment of the Construction of Solid-State Imaging Device

Figure 3:
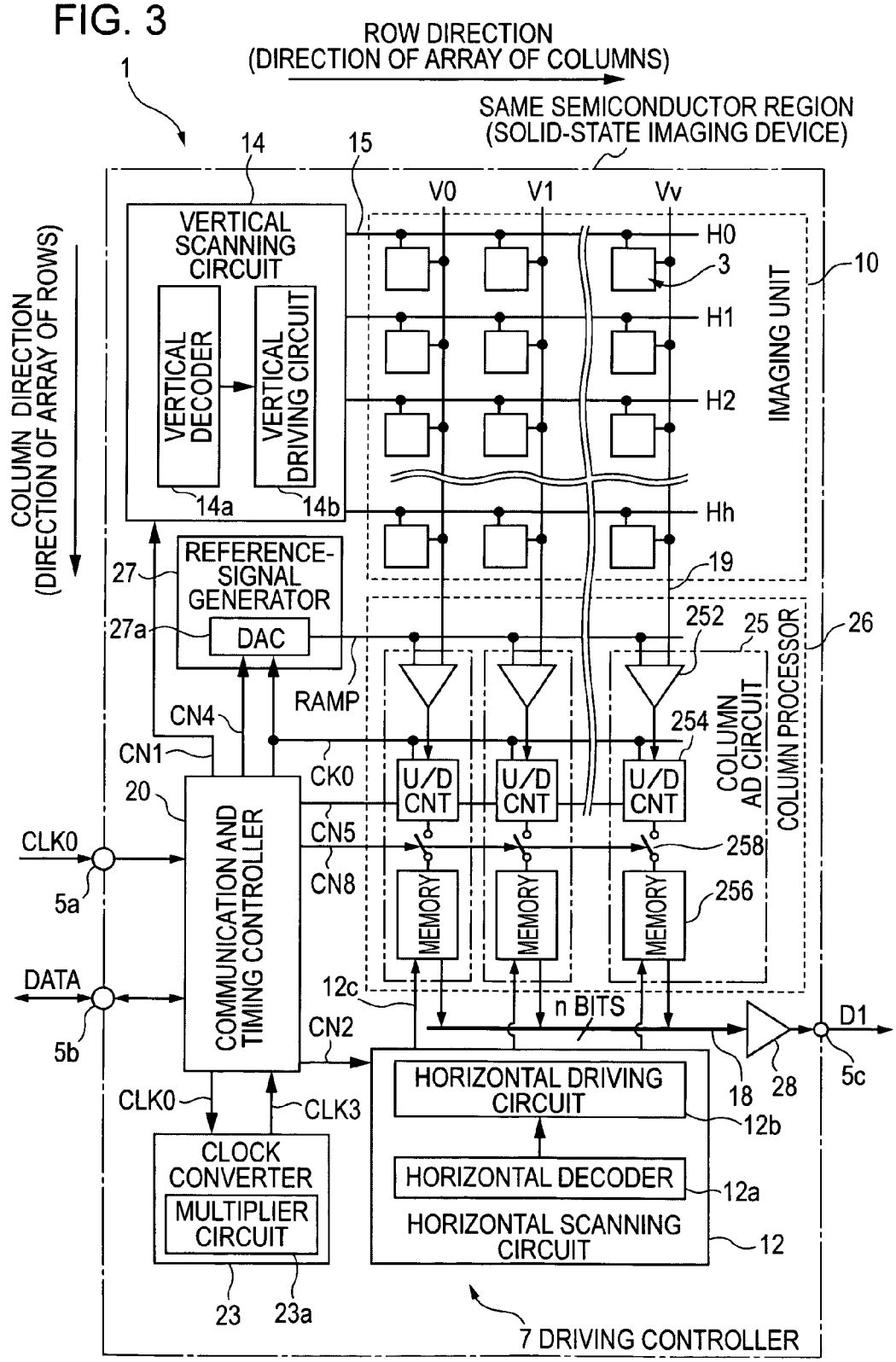
FIG. 3 is a schematic diagram showing the construction of a CMOS solid-state imaging device according to a second embodiment of the present invention.

FIG. 3 is a schematic diagram showing the construction of a CMOS solid-state imaging device (CMOS image sensor) according to a second embodiment of the present invention. In a solid-state imaging device 1 according to the second embodiment, compared with the solid-state imaging device 1 according to the first embodiment, the construction of column AD circuits 25 is modified.

In a column AD circuit 25 in the second embodiment, at a subsequent stage of a counter 254, a data storage unit 256 that functions as an n-bit memory for holding the result of counting by the counter 254, and a switch 258 disposed between the counter 254 and the data storage unit 256 are provided.

The switch 258 receives a memory transfer instruction pulse CN8 as a control pulse at a specific timing from the communication and timing controller 20, commonly with the switches 258 of the other columns. Upon receiving the memory transfer instruction pulse CN8, the switch 258 transfers a count value of the associated counter 254 to the data storage unit 256. The data storage unit 256 stores the count value transferred.

The scheme for storing the count value of the counter 254 in the data storage unit 256 at a specific timing is not limited to providing the switch 258 therebetween. For example, the counter 254 and the data storage unit 256 may be directly connected to each other while controlling an output enable terminal of the counter 254 by the memory transfer instruction pulse CN8. Alternatively, the memory transfer instruction pulse CN8 may be used as a latch clock that determines timing for the data storage unit 256 to capture data.

The data storage unit 256 receives a control pulse from the horizontal scanning circuit 12 via a control line 12c. The data storage unit 256 holds the count value received from the counter 254 until an instruction by a control pulse is received via the control line 12c.

The horizontal scanning circuit 12 has a function of a reading scanner that reads the count values held by the respective data storage units 256 concurrently with the respective voltage comparators 252 and counters 254 of the column processor 26 performing their respective operations.

According to the construction of the second embodiment described above, it is possible to transfer the result of counting held by the counter 254 to the data storage unit 256. Thus, it is possible to control counting by the counter 254, i.e., AD conversion, and the operation of reading the result of counting to the horizontal signal line 18 independently of each other. This allows AD conversion and an operation of reading signals to the outside to be performed concurrently by a pipeline operation.

Second Embodiment of the Operation of Solid-State Imaging Device

Figure 4:
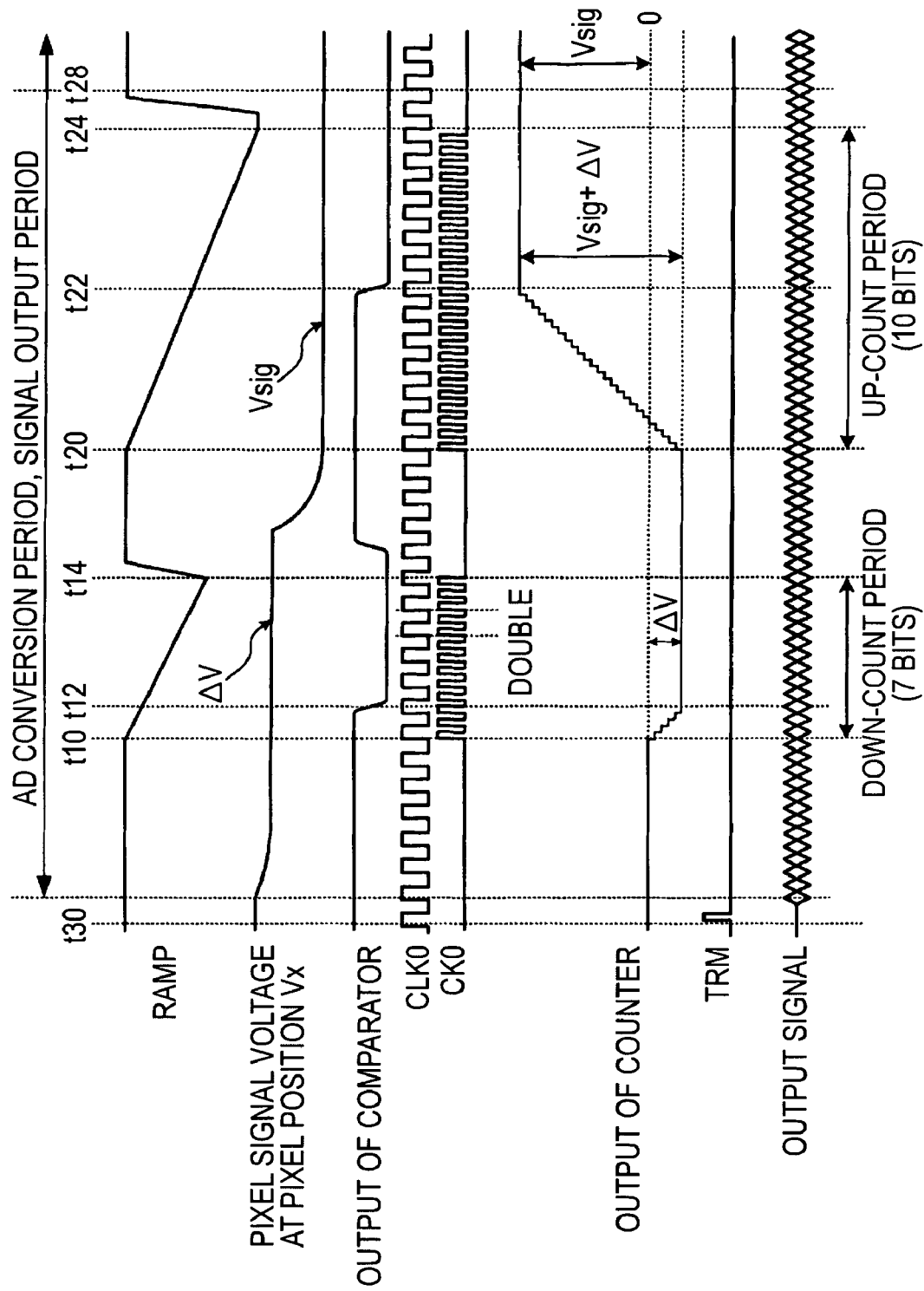
FIG. 4 is a timing chart for explaining an operation of a column AD circuit of the solid-state imaging device according to the second embodiment shown in FIG. 3.

FIG. 4 is a timing chart for explaining the operation of the column AD circuits 25 in the solid-state imaging device 1 according to the second embodiment shown in FIG. 3. AD conversion in the column AD circuits 25 is performed in the same manner as in the first embodiment, so that detailed description thereof will be omitted.

In the second embodiment, the data storage units 256 are added to the construction of the first embodiment. The basic operations including AD conversion are the same as those in the first embodiment. However, before the operation of the counter 254 (t30), based on a memory transfer instruction pulse CN8 from the communication and timing controller 20, the results of counting associated with a previous row Hx−1 is transferred to the data storage units 256.

According to the first embodiment, it is possible to output pixel data to the outside of the column processor 26 only after the second reading operation, i.e., AD conversion, is finished, so that the reading operation is restricted. In contrast, according to the second embodiment, count values representing the previous results of subtraction are transferred to the data storage units 256 before the first reading operation (AD conversion), so that the reading operation is not restricted.

In the second embodiment, preferably, in order to achieve uninterrupted concurrent operations and efficient signal output, the multiplication factor (e.g., an integer) of the count clock CK0, which is faster than the master clock CLK0 serving as a reference for the control data CN4 for controlling the reference signal RAMP for AD conversion in the voltage comparators 252 and as a reference for counting by the counters 254, and the multiplication factor (e.g., an integer) of a high-speed clock used to control the horizontal scanning circuit 12 are chosen so that a period of outputting digital signals of one row from the data storage units 256 is equal to the two periods of reading analog pixel signals from the pixel unit 10.

Accordingly, the operation of outputting signals to the outside from the data storage units 256 via the horizontal signal line 18 and the output circuit 28 and the operation of reading signals from a current row Hx and counting by the counters 254 can be performed concurrently and quickly, allowing more efficient signal output.

Third Embodiment of the Construction of Solid-State Imaging Device

Figure 5:
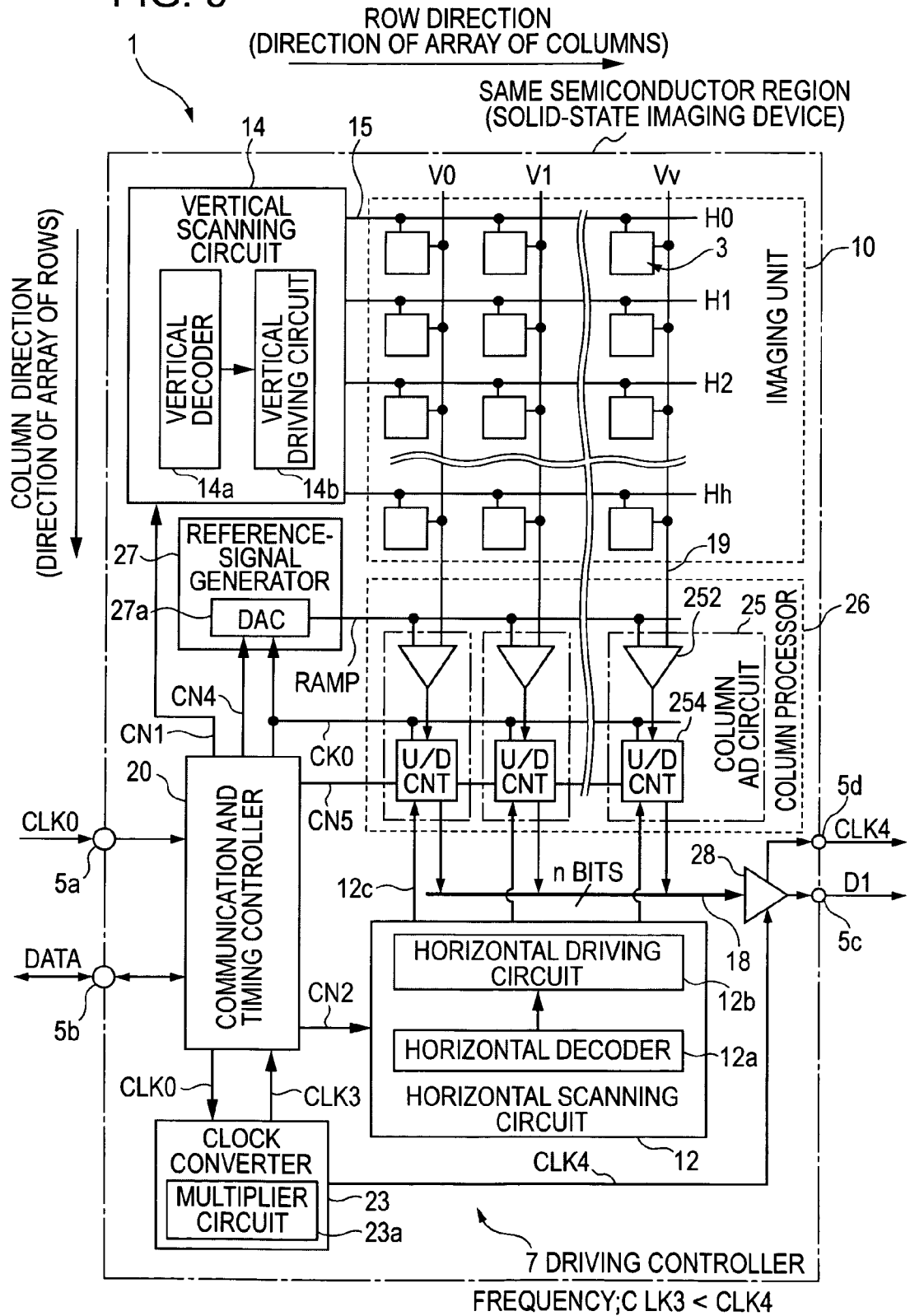
FIG. 5 is a schematic diagram showing the construction of a CMOS solid-state imaging device according to a third embodiment of the present invention.

FIG. 5 is a schematic diagram showing the construction of a CMOS solid-state imaging device (CMOS image sensor) according to a third embodiment of the present invention.

FIGS. 6A to 6D are timing charts for explaining an example of data output method in the third embodiment.

A solid-state imaging device 1 according to the third embodiment differs from the solid-state imaging device 1 according to the first embodiment in that parallel data output from the column processor 26 is converted into serial data and the serial data is output to the outside of the device as video data D1. By serializing the data for output, high-speed output is allowed with a number of terminals smaller than the number of bits of digital data obtained by AD conversion. Although the third embodiment is described as a modification to the first embodiment, a similar modification to the second embodiment is also possible.

The output circuit 28 buffers pixel data supplied from the horizontal signal line 18 using a low-speed clock CLK2 or a high-speed clock CLK4 supplied from the clock converter 23, a clock CLK1 supplied from the communication and timing controller 20, or other pulse signals, and outputs the pixel data as video (imaging) data D1 to the outside of the device. The pixel data may undergo, for example, black-level adjustment, column-variation correction, signal amplification, color processing, or signal compression before it is output as video data D1.

Figure 6A:
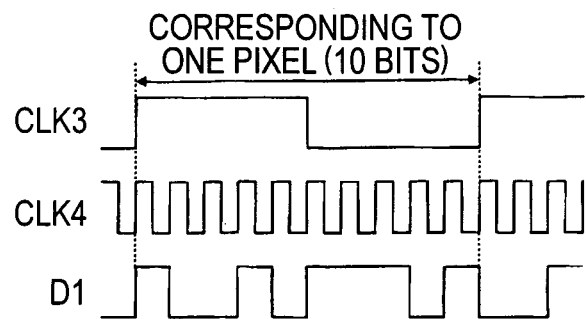
FIGS. 6A to 6D are timing chart for explaining a data output method in the third embodiment.

The output circuit 28, when it outputs data based on the high-speed clock CLK4, first captures pixel data (e.g., 10 bits) as parallel data from the column processor 26 in synchronization with a high-speed clock CLK3. Then, the output circuit 28 converts the pixel data into serial data for output in synchronization with either rising edges or falling edges (rising edges in FIG. 6A) of the high-speed clock CLK4, as shown in FIG. 6A. A circuit for converting parallel data into serial data (parallel-to-serial conversion) may be implemented by a known parallel-to-serial converter circuit. Alternatively, the same configuration as the switching unit may be used.

Figure 6B:
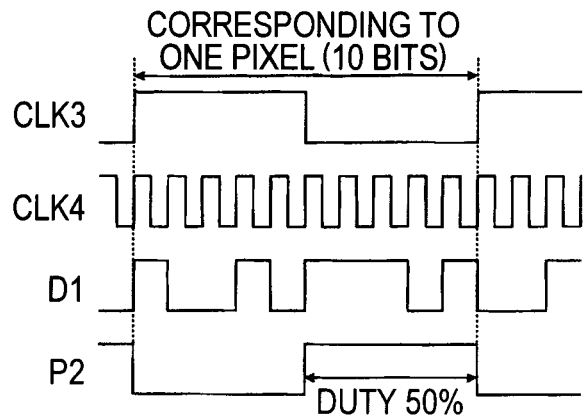
Figure 6C:
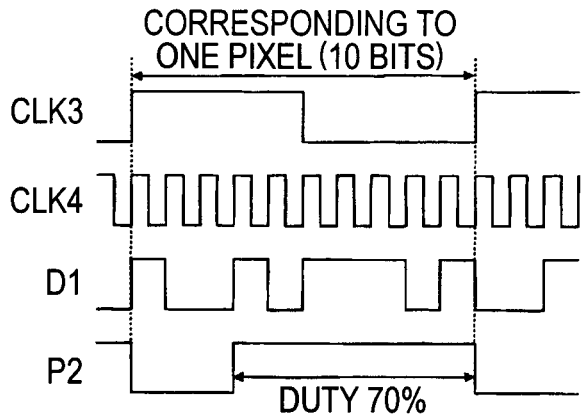
Figure 6D:
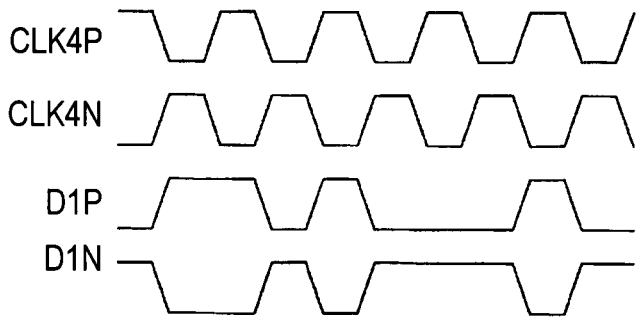

The output may be a single-ended output, or differential outputs from two output terminals as shown in FIG. 6D. Furthermore, by differentially outputting the high-speed clock CLK4 from a terminal that is different from the data output terminals while considering delay from the video data for each of the differential outputs, a data recipient outside the device is allowed to capture the video data D1P and D1N in synchronization with the associated high-speed clocks CLK4P and CLK4N. This serves to prevent error.

Assuming that n-bit parallel pixel data is output from the column AD circuits of the column processor 26 and is input to a signal processor (not shown) in each period of the high-speed clock CLKL3, the frequency of the high-speed clock CLK4 must be sufficient to convert the data into serial data in the same period. More specifically, the frequency must be at least as high as the frequency of the high-speed clock CLK3 multiplied by the number of bits n (n=10 in this embodiment). The frequency need not be increased unnecessarily, so that the frequency of the high-speed clock CLK4 herein is 10 times the frequency of the high-speed clock CLK3, as shown in FIGS. 6A to 6D.

The output circuit 28, in addition to outputting the video data D1 from the output terminal 5c, also functions as a high-speed-clock outputting unit that outputs the high-speed clock CLK4 that is faster than the high-speed clock CLK3 generated by the clock converter 23 from a terminal that is different from the data terminal. For example, the output circuit 28 serializes the bit data of the video data D1 in synchronization with rising edges and sequentially outputs the resulting serial data from the terminal 5c, and outputs the high-speed clock CLK4 used at this time from a terminal 5d. At this time, the high-speed clock CLK4 is output with consideration of delay from the video data D1. Considering delay refers to maintaining constant relationship between data switching positions of the bits of the serial video data D1 and the edges of the high-speed clock CLK4 (e.g., substantially at the same positions).

As described above, by causing the column processor 26 to operate at a high speed using the high-speed clock CLK3 generated from the master clock CLK0, and causing the output circuit 28 at an even higher speed (hyper speed), the range of circuitry that operates at a hyper speed is minimized. This serves to reduce power consumption.

Furthermore, in this embodiment, by providing the clock converter 23 in proximity to the output circuit 28 that requires the high-speed clock CLK4 for parallel-to-serial conversion so that the high-speed clock CLK4 is generated in the proximity of the output circuit 28, complex wiring for the high-speed clock CLK4 is not needed. Thus, the pixel unit 10 and the column processor 26 can be prevented from being affected by noise. Furthermore, since complex wiring for the high-speed clock CLK4 is not needed and wiring for the high-speed clock CLK4 can be localized within the proximity of the output circuit 28, electromagnetic interference can be suppressed. For example, noise caused by electromagnetic interference on the video data D1 can be reduced.

According to the CMOS solid-state imaging device 1 constructed as described above, the pixel unit and the column circuits operate at a relatively low frequency, and the output unit performs parallel-to-serial conversion using the high-speed clock CLK4, so that the output unit is allowed to operate at a high speed with a small number of terminals. Thus, power consumption of the device as a whole is reduced, suppressing noise. Furthermore, since the master clock input from the outside of the imaging device has a low frequency, loss that occurs between a previous stage and the CMOS sensor can be suppressed, and electromagnetic interference can be suppressed. Thus, it is possible to manufacture a small, inexpensive, and reliable camera for capturing moving pictures and still pictures.

In addition to the video data D1, by outputting the high-speed clock CLK4 from a terminal (5d in this embodiment) that is different from the data output terminal (5c in this embodiment) while considering delay from the video data D1, a data recipient outside the device is allowed to capture the video data D1 in synchronization with the high-speed clock CLK4. This serves to prevent error.

When the high-speed clock CLK4 is output with the video data D1 as described above, specifications regarding jitter of the high-speed clock CLK4 become loose, so that a compact design of PLL is allowed. In order to avoid the effect of jitter, however, preferably, the high-speed clock CLK4 is not used in parts that handle analog signals, such as the pixel unit 10 and the column processor 26.

As in techniques used in the field of communications, it is possible to serialize data and to embed a clock (e.g., as a synchronization signal) in the resulting serial data so that the video data D1 and the high-speed clock CLK4 can be output substantially from a common terminal. This serves to reduce an interface terminal or wiring.

Furthermore, in addition to outputting the high-speed clock CLK4, boundary data P2 representing a pixel boundary may be output as data having a frequency lower than the frequency of the high-speed clock CLK4 from a terminal 5e that is different from the terminals 5c and 5d for the video data D1 and the high-speed clock CLK4, as shown in FIG. 6B. For example, in this embodiment, a clock having the same frequency as the high-speed clock CLK3, representing the beginning or end of the 10-bit video data D1, may be output as the boundary data P2.

This is because when serial data is output, it is not possible to play back an image correctly if the boundaries of the pixels of the data are not correctly recognized on the receiving side. When data is output at a data rate of several ten MHz, error is not likely to occur. However, as the data rate increases, identification information serves to prevent error. That is, when the frequency is low, the receiving side is allowed to track data to a certain extent without using the boundary data P2, so that it is possible to detect each pixel in the serial data. However, as the frequency increases, due to the instability of data playback or the like, the possibility of incorrectly determining a pixel boundary increases. Furthermore, when an error occurs, the error is propagated to subsequent pixel data, causing serious effect. Thus, it is effective to use the boundary data P2 having a frequency lower than the frequency of the high-speed clock CLK4.

The boundary data P2 may be generated, for example, by a TG block of the communication and timing controller 20, the clock converter 23, or a signal processor (not shown). Although the duty ratio (HIGH period/one period) is 50% is FIG. 6B, so that the high-speed clock CLK3 and the data have substantially opposite polarities, the duty ratio need not be 50%, as shown in FIG. 6C.

FIRST EXAMPLE OF OUTPUT CIRCUIT

Figure 7:
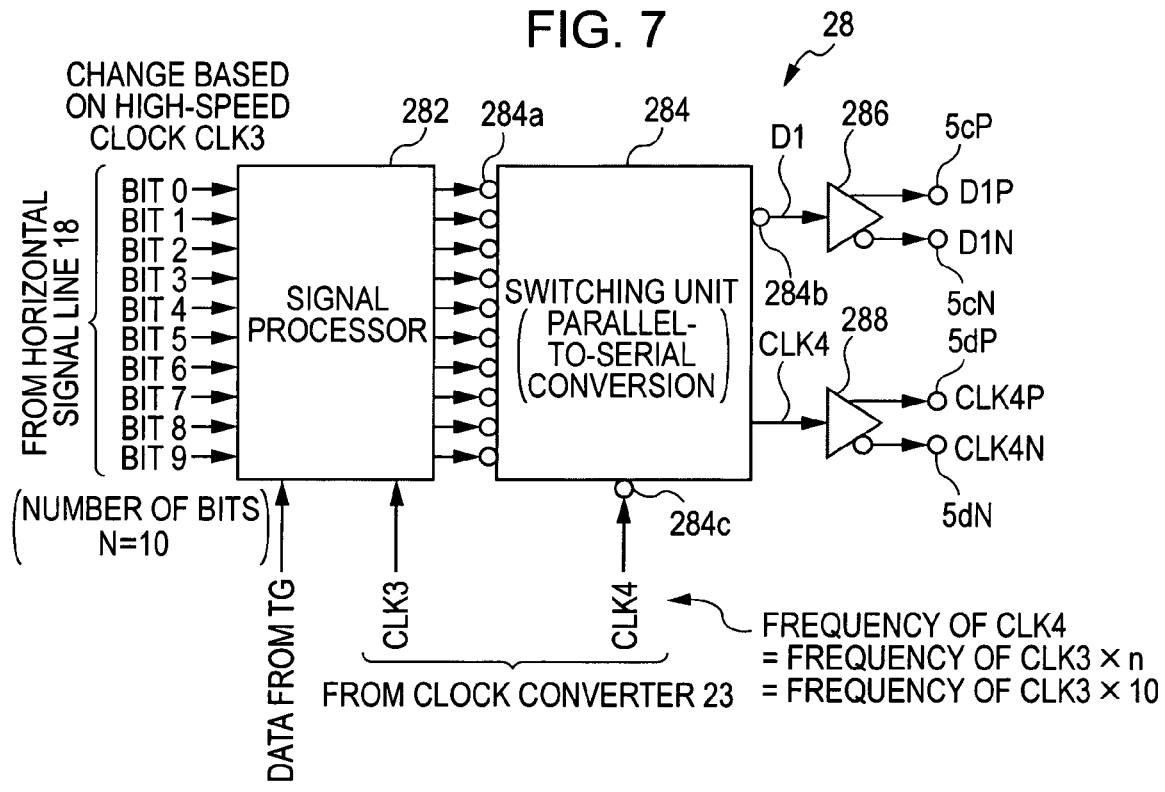
FIG. 7 is a block circuit diagram showing a first example configuration of an output circuit.

FIG. 7 is a circuit block diagram showing a first example configuration of the output circuit. The output circuit 28 according to the first example shown in FIG. 7 includes a digital signal processor and employs differential output. Although not shown, a similar arrangement may be used for a single-ended output.

The output circuit 28 according to the first example shown in FIG. 7 includes a digital signal processor 282 for performing digital signal processing on 10-bit digital data D0 input from horizontal signal lines 18, a switching unit 284, and output buffers 286 and 288.

The signal processor 282 receives predetermined data from the TG block of the communication and timing controller 20, and receives the high-speed clock CLK3 from the clock converter 23. The switching unit 284 receives the high-speed clock CLK4 from the clock converter 23.

The signal processor 282 captures the pixel data D0 in parallel from the ten horizontal signal lines 18 in synchronization with the high-speed clock CLK3. The signal processor 282 performs, for example, black-level adjustment, column-variation correction, signal amplification, color processing, or signal compression on the data D0 captured, using the same high-speed clock CLK3. Then, the signal processor 282 inputs the processed 10-bit digital data D1 bitwise to the input terminals of the switching unit 284.

The switching unit 284 includes a multiplexer (a multiple-input single-output selector switch, not shown). The respective input terminals 284a of the multiplexer individually receive parallel data from the signal processor 282. The data input to one of the input terminals 284a is selected and output from an output terminal 284b. A control terminal 284c of the multiplexer receives the high-speed clock CLK4 from the clock converter 23 as a switching instruction. By using the multiplexer described above as a parallel-to-serial converter, parallel-to-serial conversion can be achieved by a simple circuit configuration.

The switching unit 284 constructed as described above, using the high-speed clock CLK4 as a switching instruction, selects each bit of the ten bits input from the respective input terminals in a predetermined order and outputs it from the output terminal 284b, thereby converting parallel data into serial data (i.e., performing parallel-to-serial conversion). The switching unit 284 leads the video data D1 after the parallel-to-serial conversion to the output buffer 286 for data. Furthermore, the switching unit 284 leads the high-speed clock CLK4 used for parallel-to-serial conversion to the output buffer 288 for clock.

The output buffers 286 and 288 each have a function of a differential converter. For example, the output buffer 286 differentially outputs non-inverted video data D1P and inverted video data D1N respectively from the associated two output terminals 5cP and 5cN. Similarly, the output buffer 288 differentially outputs the high-speed clock CLK4 and inverted high-speed clock CLK4N respectively from the associated two output terminals 5dP and 5dN, considering delay from the video data D1 for the high-speed clock CLK4 and considering delay from the inverted video data D1N for the inverted high-speed clock CLK4N.

In the output circuit 28 according to the first example shown in FIG. 7, data is input to the output circuit 28 in synchronization with the high-speed clock CLK3, and the video data D1 is output in synchronization with the high-speed clock CLK4. Furthermore, the high-speed clock CLK4 is also output. Thus, basically, the same advantages as in the third embodiment described earlier can be achieved.

Furthermore, in the output circuit 28 according to the first example shown in FIG. 7, an advantage specific to differential output can be achieved. More specifically, as the operation speed increases, pulse waveforms become less sharp, and abnormal components such as ringing are likely to occur. The operation is directly affected by these problems in the case of a single output. In contrast, in the case of differential output, it is possible to reproduce a waveform using both differential outputs. This serves to improve insusceptibility to noise. This applies to the high-speed clock CLK4 as well as the data D1. Thus, the first example employing differential output allows operation at a higher frequency compared with the third embodiment employing single-ended output. To put it conversely, the third embodiment employing single-ended output suffices for operation at a middle frequency.

Furthermore, in the first example configuration, it is possible to use low voltage differential signaling (LVDS) that employs a current-mode differential interface. This serves to improve insusceptibility to noise and to suppress electromagnetic interference. When a current-mode interface is employed, currents are exchanged (not simultaneously) between the transmitting output circuit 28 and the receiving circuit or IC at a subsequent stage, generating an electromagnetic field that causes electromagnetic interference, affecting peripheral circuits or the outside of the solid-state imaging device 1.

In contrast, when a current-mode interface is implemented based on differential output using non-inverted data P and inverted data N as in the first example configuration, although currents are exchanged between the transmitting output circuit 28 and the receiving circuit or IC at a subsequent stage, currents are constantly exchanged simultaneously, generating electromagnetic fields in opposite directions. Thus, the electromagnetic fields cancel each other, so that it can be assumed as a whole that an electromagnetic field that causes electromagnetic interference is not generated. In order to improve this effect, preferably, two differential output lines are provided in proximity to each other to form an interface between the output circuit 28 and an external circuit. For this purpose, preferably, a twisted pair cable is used.

SECOND EXAMPLE OF OUTPUT CIRCUIT

Figure 8:
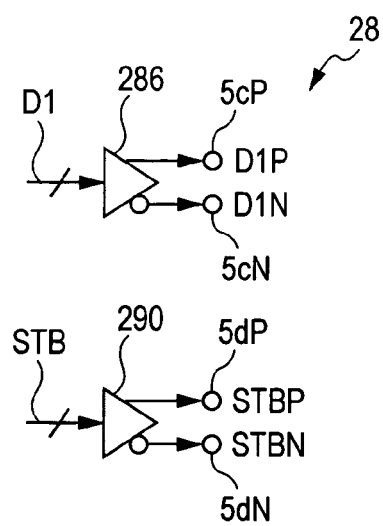
FIG. 8 is a block circuit diagram showing a second example configuration of an output circuit.
Figure 9:
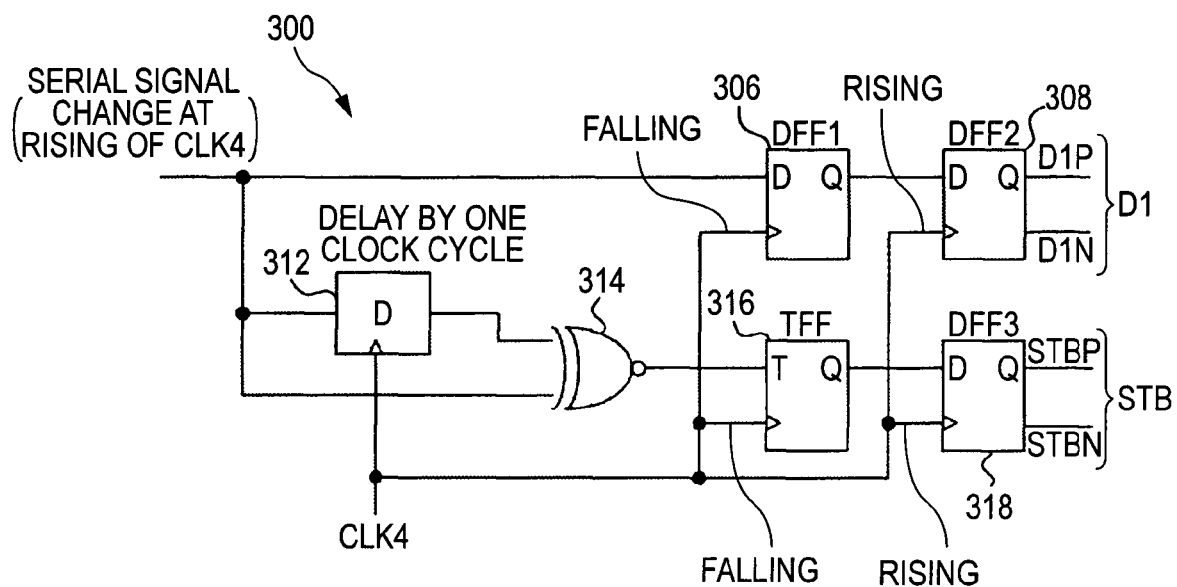
FIG. 9 is a block circuit diagram showing an example configuration of a strobe-data generator in the second example of output circuit shown in FIG. 8.
Figure 10:
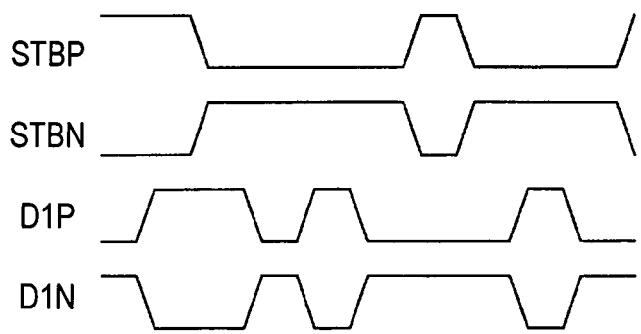
FIG. 10 is a timing chart for explaining a data output method in the second example of output circuit shown in FIG. 8.

FIG. 8 is a block circuit diagram showing a second example configuration of the output circuit. FIG. 8 only shows the proximity of an output buffer relating to differential output. FIG. 9 is a block circuit diagram showing an example configuration of a strobe-data generator in the second example of output circuit shown in FIG. 8. FIG. 9 only shows one side of differential output. FIG. 10 is a timing chart for explaining a data output method in the second example of output circuit shown in FIG. 8. In the second example, strobe data STB that allows reproducing a clock that is used for timing when image data is output at a high speed by taking exclusive OR with serial n-bit output data is output.

The strobe data STB is used instead of the high-speed clock CLK4. That is, the strobe data STB is output from the terminal 5d. The strobe data STB is a data signal that is inverted at a timing at which the video data D1 is not inverted.

The strobe data STB is generated in the signal processor 282 or the switching unit 284 at a previous stage of an output buffer 290. The strobe data STB is output via the output buffer 290 similar to the output buffer 286. For example, when a strobe-signal generator is provided at a subsequent stage of an arrangement for serializing signals, the strobe-signal generator can be configured as shown in FIG. 9.

In a strobe-signal generator 300, data obtained by parallel-to-serial conversion is delayed by one clock cycle based on the high-speed clock CLK4 by a D flip-flop 312, and is XORed with an exclusive OR circuit (NXOR) 314, and the result is input to a T flip-flop 316, whereby the strobe data STB is generated.

At this time, the D flip-flop 312 and the T flip-flop 316 (falling-edge synchronization) prevents incorrect operation based on edges of the high-speed clock CLK4 as shown in FIG. 9. A delay of half clock cycle is provided by passing serial data through a D flip-clop 306 (falling-edge synchronization).

Then, by passing the serial data and the strobe data STB through D flip-flops 308 (rising-edge synchronization) and 318 (falling-edge synchronization) that operate based on different edges, the phases of these data are matched.

Non-inverted data D1P and STBP output from the non-inverting terminals Q of the respective D flip-flops 308 and 318 are output from the non-inverting terminals 5cP and 5dP via the output buffers 286 and 290. Inverted data D1N and STBN output from the inverting terminals QN of the respective D flip-flops 308 and 318 are output from the inverting terminals 5cN and 5dN via the output buffers 286 and 290.

As will be understood from FIG. 6D, when the high-speed clock CLK4 is output normally, the high-speed clock CLK4 and the video data D1 could be inverted simultaneously. When both are inverted simultaneously, loads for both is put on the device output, and the timing depends on the video data D1 and is therefore not constant.

In contrast, by using the strobe data STB, as will be understood from FIG. 10, only one of the video data D1P and the strobe data STBP, or only one of the video data D1N and the strobe data STBN is inverted. Thus, only the load for one of the data is put on the device output, and the load is also constant. Furthermore, by taking exclusive OR between the strobe data STB and the video data D1, it is possible to reproduce the high-speed clock CLK4 in a circuit block or IC provided at a subsequent stage of the output circuit 28.

That is, when an output via the horizontal signal lines 18 is faster than the master clock input from the outside, by simultaneously outputting a strobe signal in accordance with the output based on a signal generated based on a high-speed clock supplied from the clock converter 23 (e.g., multiplied by an integer), signals can be transmitted more stably.

Although application to differential output has been described above, application to single-ended output is possible by modifying the arrangement so that either non-inverted signal or inverted signal is used for each of the video data D1 and the strobe data STB.

Fourth Embodiment of the Construction of Solid-State Imaging Device

Figure 11:
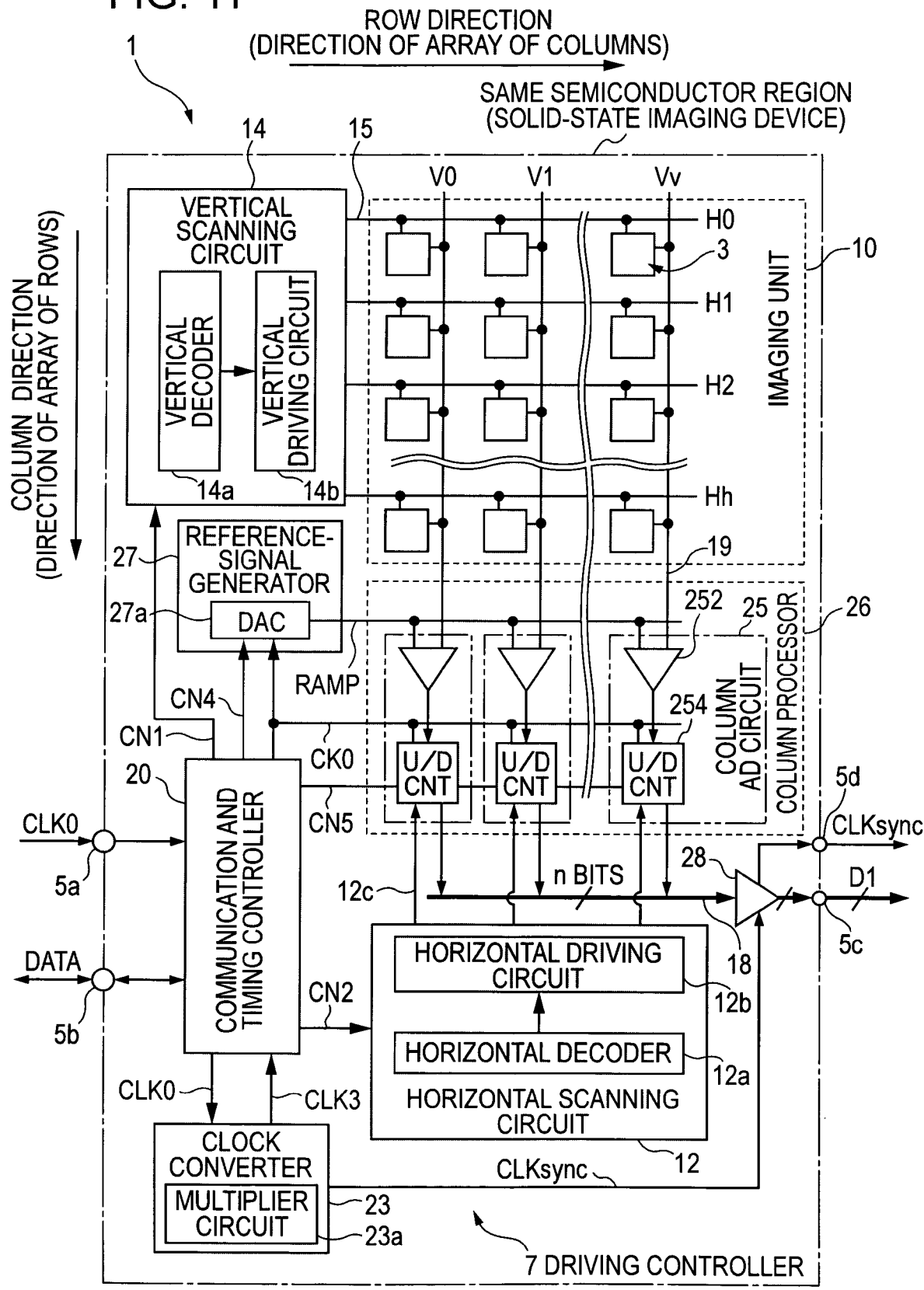
FIG. 11 is a schematic diagram showing the construction of a CMOS solid-state imaging device according to a fourth embodiment of the present invention.

FIG. 11 is a schematic diagram showing the construction of a CMOS solid-state imaging device (CMOS image sensor) according to a fourth embodiment of the present invention. In a solid-state imaging device 1 according to the fourth embodiment, by controlling the horizontal scanning circuit 12 according to a signal generated from a high-speed clock, parallel data output from the column processor 26 is output to the outside of the device as parallel video data D1. At this time, as opposed to the first embodiment, a high-speed clock CLKSync for synchronization is output from a terminal 5d that is different from a terminal from which the video data D1 is output.

The output circuit 28, when it outputs data in parallel based on the high-speed clock CLKSync for synchronization, captures pixel data (e.g., 10 bits) as parallel data from the column processor 26 in synchronization with the high-speed clock CLKSync for synchronization under the control of the horizontal scanning circuit 12, buffers the pixel data, and outputs the pixel data as parallel data from the terminal 5c.

Concurrently, the output circuit 28 buffers the high-speed clock CLKSync for synchronization, used to capture the data, and outputs it from the terminal 5d. The output may be single-ended output, or differential outputs from two output terminals.

Even when the output is not serialized, when the horizontal scanning circuit 12 is controlled according to a high-speed clock, the output data rate is higher than the master clock, so that data could fluctuate. The fluctuation could cause a problem in the receiving operation of a receiving external device. That is, error could occur when the video data is captured.

In contrast, according to the fourth embodiment, the high-speed clock CLKSync for synchronization is output with parallel data. Thus, an external device receives the parallel data in synchronization with the high-speed clock CLKSync for synchronization, so that error in capturing video data can be prevented.

As described above, according to the AD conversion method, the AD converter, the semiconductor device, and the electronic apparatus of the aspects of the present invention, a signal subject to processing including a reference component and a signal component is compared with a reference signal for AD conversion, and concurrently with the comparison, counting is performed in a down-count mode or an up-count mode based on a high-speed counter clock having a frequency that is higher than a frequency of a master clock, holding a count value at a time of completion of the comparison, while switching mode of counting according to whether comparison is being performed for the reference component or the signal component.

By performing AD conversion using the high-speed counter clock as described above, the processing speed of AD conversion is not restricted by the rate (frequency) of the master clock. Even when a difference signal component representing the difference between the reference component and the signal component is converted into digital data by performing AD conversion in two iterations, the AD conversion can be performed quickly as a whole, allowing reduction in the AD conversion period.

When the count value held in the second processing iteration for a previous signal subject to processing is stored in a data storage unit and the first processing iteration and the second processing iteration are performed for a current signal subject to processing, by concurrently reading the count value from the data storage unit based on a second high-speed clock having a frequency that is higher than the frequency of the master clock, when AD conversion and reading are performed concurrently by pipeline processing, the processing speed of reading is not restricted by the rate (frequency) of the master clock.

Furthermore, since AD conversion for the reference component and the signal component is performed while switching between the down-count mode and the up-count mode, digital data representing the difference between the reference component and the signal component can be obtained as a result of performing counting in the down-count mode and in the up-count mode.

Thus, memories for holding the results of counting associated with the reference component and the signal component can be implemented by a latch function of the counter. Therefore, special memories for holding data obtained by AD conversion needed not be provided separately from the counter. This serves to avoid increase in circuitry scale or circuit area.

Furthermore, irrespective of whether to use a common up/down counter, since the AD converter includes a comparator and a counter, counting can be controlled by a single count clock for the operation of the counter and a control line for switching count mode irrespective of the number of bits. Therefore, a signal line for leading a count value of the counter to a memory is not needed. This serves to avoid increase in noise or increase in power consumption.

By using a common up/down counter irrespective of operation mode and switching processing mode of the up/down counter for counting, it is possible to directly subtract the reference component from the signal component, so that a special subtractor for subtracting the reference component from the signal component is not needed. Furthermore, data need not be transferred to a subtractor. This serves to avoid increase in noise, increase in current, or increase in power consumption.

When the counter is implemented by a combination of a down-counter circuit and an up-counter circuit, by setting a count value obtained in the first counting operation as an initial value before the second counting operation is started, it is possible to directly subtract the reference component from the signal component, so that a special subtractor for subtracting the reference component from the signal component is not needed. Furthermore, data need not be transferred to a subtractor. This serves to avoid increase in noise, increase in current, or increase in power consumption.

When the counter is implemented by a combination of a down-counter circuit and an up-counter circuit, instead of setting a count value obtained in the first counting operation as an initial value, counting may be started from zero. In that case, an adder circuit for adding up count values is needed. Even in this case, since the adder circuit is provided for each AD converter including a comparator and a counter, short lines suffice. Thus, increase in noise, increase in current, or increase in power consumption due to data transfer can be avoided.

Furthermore, since the AD converter includes a comparator and a counter, when a signal subject to processing is a unit signal output from a semiconductor device including a matrix of unit elements, even when a plurality of AD converters is arrayed in a row direction in which columns of the unit elements are arrayed, a counter is provided in each of the AD converters. Thus, as opposed to the related art shown in FIG. 13, lines for count outputs from a counter need not be extended to a latch. This serves to avoid increase in noise or increase in power consumption due to wiring.

Furthermore, even when AD conversion and reading are performed concurrently by a pipeline operation, it suffices to provide a single memory for holding data obtained by AD conversion for each AD converter. This serves to minimize increase in circuit area. When comparison and down-counting are performed for the reference component in the first processing iteration and comparison and up-counting are performed for the signal component in the second iteration, the count value held after the second processing iteration is a positive digital value obtained by subtracting the reference component from the signal component. When the signal component appears temporally after the reference component in a signal subject to processing, supplied from a unit element, a positive value in the form of digital data representing an effective signal component of the unit element is obtained.

Although the embodiments of the present invention have been described above, the scope of the present invention is not limited to the embodiments. Various modifications or improvements of the embodiments are possible without departing from the spirit of the present invention, and the modifications and improvements are included in the scope of the present invention.

The embodiments described above are not intended to limit the claims, and all the features of the embodiments are not necessarily needed. The embodiments described above include various phases of invention, and various aspects of the present invention can be extracted by appropriately combining the features described. Even if some features of the embodiments are removed, an arrangement including the remaining features can be extracted as an aspect of the present invention as long as similar advantages can be achieved.

For example, in the embodiments described above, the column AD circuit 25 including the voltage comparator 252 and the counter 254 is provided for each column and signals are converted into digital data on a column-by-column basis, without limitation to the arrangement described above, a single column AD circuit 25 may be provided for a plurality of columns with a switching circuit for switching among the columns.

Furthermore, although an AD conversion function is implemented in a column region provided on the reading side of the pixel unit 10, an AD conversion function may be implemented in other regions. For example, pixel signals are output in analog up to the horizontal signal line 18, and the pixel signals are then AD-converted before being passed to the output circuit 28.

Even in this case, when a signal subject to processing including a reference component and a signal component is compared with a reference signal for AD conversion, concurrently with the comparison, counting is performed in a down-count mode or an up-count mode, holding a count value at a time of completion of the comparison, by switching counting mode according to whether comparison is being performed for the reference component or the signal component, it is possible to obtain digital data representing the difference between the reference component and the signal component as results of performing counting in the down-count mode and in the up-count mode.

Thus, memories for holding the results of counting associated with the reference component and the signal component can be implemented by a latch function of the counter, so that special memories for holding data obtained by AD conversion needed not be provided separately from the counter. It suffices to provide a single AD converter for all the columns. Although high-speed conversion is needed, circuitry scale is reduced compared with the embodiments described above.

Furthermore, although the second counting operation is started from a count value held in the first counting operation, when a synchronous up/down counter that outputs a count value in synchronization with the count clock CK0 is used, this can be achieved without employing a special measure for mode switching.

However, when an asynchronous up/down counter, which is advantageous for high-speed operation since the limiting operation frequency is determined only by the limiting frequency of the first flip-flop (element of the counter), is used, the count value becomes corrupted when count mode is switched, so that it is not possible to continue counting normally while maintaining the count value before and after switching. Thus, preferably, an adjustor that allows the second counting operation to be started from a count value held in the first counting operation is provided. The adjustor will not be described in detail herein.

Furthermore, in the embodiments described above, in a pixel signal of a pixel, a signal component Vsig appears temporally after a reset component ΔV (reference component), and a processor at a subsequent stage processes a signal of positive polarity (the positive value becomes larger as the signal level becomes larger). In the first processing iteration, comparison and down-counting are performed for the reset component ΔV (reference component), and in the second processing iteration, comparison and up-counting are performed for the signal component Vsig. However, irrespective of the temporal order of the reference component and the signal component, combination and processing order of components and count modes are arbitrary. Depending on the processing order, digital data obtained in the second iteration becomes a negative value, in which case correction is performed or other suitable measure is taken.

Obviously, when the device architecture of the pixel unit 10 is such that the reset component ΔV (reference component) must be read after the signal component Vsig and a processor at a subsequent stage handles signals of positive polarity, it is efficient to perform comparison and down-counting for the signal component Vsig in the first processing iteration and to perform comparison and up-counting for the reset component ΔV (reference component) in the second processing iteration.

Furthermore, although an up/down counter is commonly used irrespective of operation mode and the processing mode of the up/down counter is switched in the embodiments described above, as long as counting in the down-count mode and in the up-count mode can be performed in combination for the reference component and the signal component, the arrangement is not limited to an up/down counter that is capable of mode switching.

For example, the counter may be implemented by a combination of a down-counter circuit that performs down-counting for one of the reference component and the signal component and an up-counter circuit that performs up-counting for the other one of the reference component and the signal component.

Figure 12A:
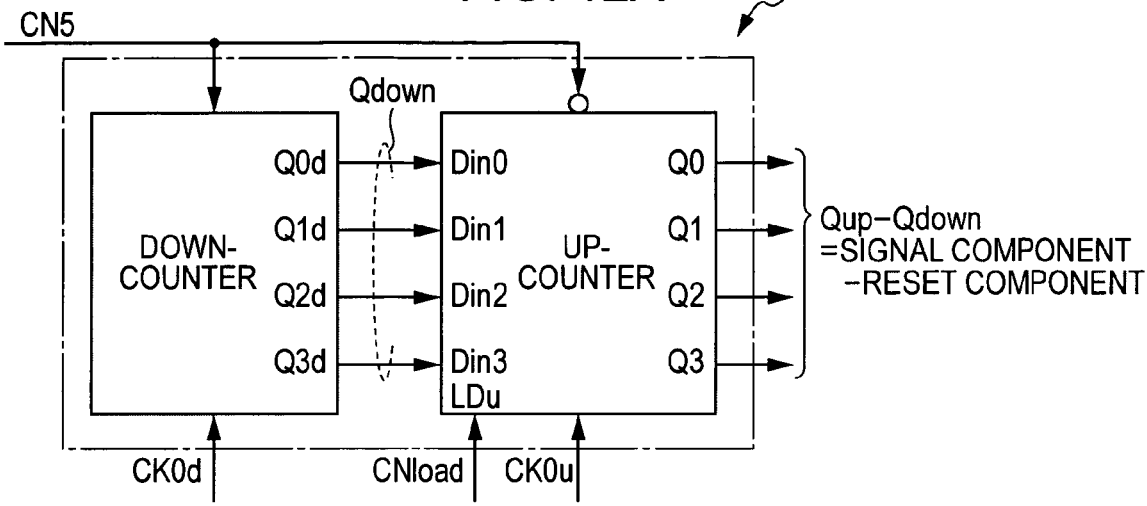
FIGS. 12A to 12C are block circuit diagrams showing modifications of a counter.

In that case, preferably, a counter circuit that performs the second counting operation allows loading an arbitrary initial value using known techniques. For example, when up-counting is performed after down-counting, the down-counter circuit is activated in the first counting operation and the up-counter circuit is activated in the second counting operation, as shown in FIG. 12A.

At this time, before starting up-counting after switching count mode according to a switching control signal CN5 for switching count mode, a switching control signal CNload for setting an initial value is supplied to a load terminal LDu of the up-counter circuit so that a down-count value obtained by down-counting is set to the up-counter circuit as an initial value.

Figure 12B:
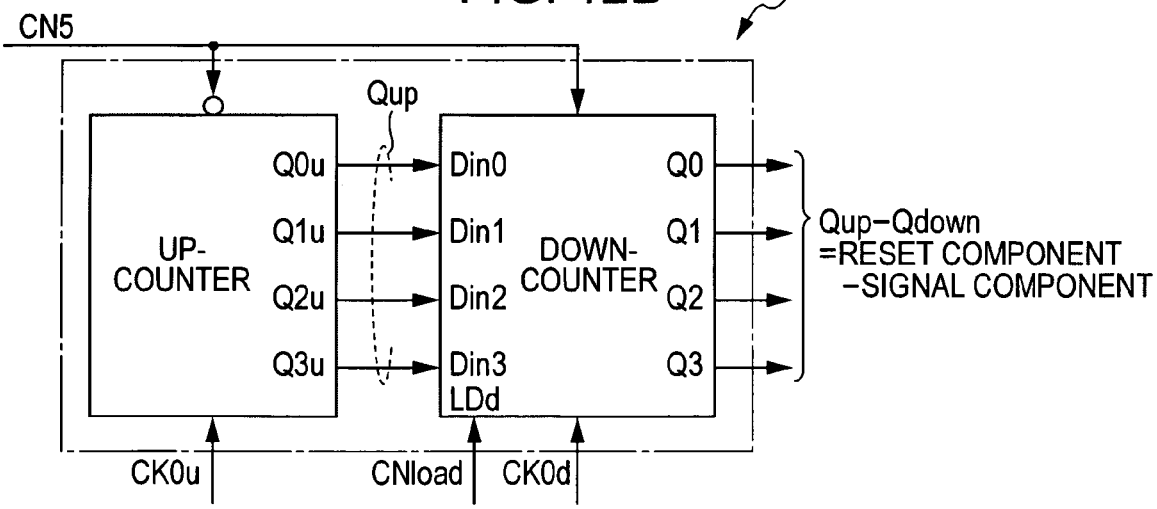

When down-counting is performed after up-counting, the up-counter circuit is activated in the first counting operation and the down-counter circuit is activated in the second counting operation, as shown in FIG. 12B.

At this time, before starting down-counting after switching count mode according to a switching control signal CN5 for switching count mode, a switching control signal CNload for setting an initial value is supplied to a load terminal of the down-counter circuit so that an up-count value obtained by up-counting is set to the down-counter circuit as an initial value.

Thus, either in the case shown in FIG. 12A or the case shown in FIG. 12B, as an output Qup−Qdown of the counter circuit at a subsequent stage, it is possible to directly subtract the reference component from the signal component, so that a special subtractor circuit for subtracting the reference component from the signal component is not needed. Furthermore, as opposed to the techniques described in the first non-patent document, data need not be transferred to a subtractor. This serves to avoid increase in noise, increase in current, or increase in power consumption.

Figure 12C:
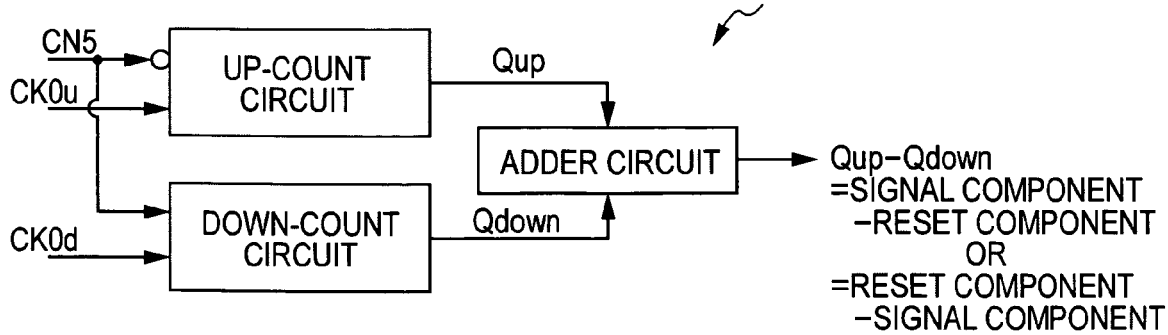

When the counter is implemented by a combination of a down-counter circuit and an up-counter circuit, in the second counting operation, instead of setting a count value obtained in the first counting operation as an initial value, counting may be started from zero. In that case, as shown in FIG. 12C, an adder circuit for adding up an output Qup of the up-counter circuit and an output Qdown of the down-counter circuit is needed. Even in this case, the adder circuit is provided for each AD converter including a comparator and a counter, so that short wiring suffices. This serves to avoid increase in noise, increase in current, or increase in power consumption associated with data transfer.

In any of the arrangements shown in FIGS. 12A to 12C, the communication and timing controller 20 is allowed to instruct operations of the down-counter circuit and the up-counter circuit as in the embodiments described above. Furthermore, the down-counter circuit and the up-counter circuit can operate based on the count clock CK0.

Furthermore, although the embodiments have been described in the context of a sensor including NMOS unit pixels as an example, without limitation to the example, the same operations and advantages as in the embodiments described above can be achieved for a sensor including PMOS unit pixels by considering the potential relationship as reversed (considering the polarities of potential as reversed).

Furthermore, although the embodiments have been described in the context of a CMOS sensor including a pixel unit that generates signal charges in response to light received as an example of solid-state imaging device that is capable of arbitrarily selecting and reading signals from individual unit pixels by address control, signal charges may be generated in response to electromagnetic waves in general, such as infrared rays, ultraviolet rays, or X rays, without limitation to light. The features of the embodiments described above can be applied to a semiconductor device including a large number of unit elements that output analog signals corresponding to electromagnetic waves received.

The embodiments have been described in the context of an example where an AD converter (column AD circuits in the example described above) including a comparator that compares a signal corresponding to a reference component and a signal corresponding to a signal component with a reference signal for AD conversion and a counter that performs counting in a down-count mode or an up-count mode and holds a count value at a time of completion of the comparison in the comparator. However, the scheme of AD conversion in the embodiments described above may be applied to any electronic apparatus employing AD conversion for converting a difference signal component between two signal components, without limitation to a solid-state imaging device.

For example, by performing AD conversion outside the solid-state imaging device 1 using the comparator and the counter based on analog pixel signals captured from the solid-state imaging device 1, an electronic apparatus that obtains digital data (pixel data) of a true signal component and that performs desired digital signal processing based on the pixel data can be constructed.

Furthermore, the AD converter described in relation to the embodiments need not necessarily be provided as included in a solid-state imaging device or an electronic apparatus, and may be provided as an independent device in the form of an integrated circuit (IC) or an AD conversion module.

In this case, although the AD converter including the comparator and the counter may be provided, an IC in which a reference-signal generator that generates the reference signal for AD conversion and supplies it to the comparator and a controller that switching counting mode in the counter according to whether the comparator is performing comparison for the reference component or the signal component is provided on the same semiconductor substrate, or a module including a combination of discrete chips, may be provided.

Accordingly, functional units that are needed to control the operations of the comparator and the counter can be handled in an integrated manner, facilitating handling and management of parts. Furthermore, since elements needed for AD conversion are integrated in the form of an IC or a module, manufacturing of a finished product of a solid-state imaging device or an electronic apparatus is facilitated.

What is claimed is:

1. An analog-to-digital conversion method for obtaining digital data of a difference signal component representing a difference between a reference component and a signal component included in an analog signal,
wherein, in a first processing iteration, a signal corresponding to one of the reference component and the signal component is compared with a reference signal for conversion into digital data, and concurrently with the comparison, counting is performed in one of a down-count mode and an up-count mode based on a high-speed counter clock composed of pulses having a frequency that is higher than a frequency of a master clock composed of base pulses corresponding to driving pulses for capturing the analog signal subject to processing, holding a count value at a time of completion of the comparison, and
in a second processing iteration, the other one of the reference component and the signal component is compared with the reference signal, and concurrently with the comparison, counting is performed in the other one of the down-count mode and the up-count mode based on the high-speed counter clock, holding a count value at a time of completion of the comparison.

2. The analog-to-digital conversion method according to claim 1, wherein the counting in the down-count mode and the up-count mode are performed using a common up/down counter while switching processing mode of the up/down counter.

3. The analog-to-digital conversion method according to claim 1, wherein the counting in the second processing iteration is started from the count value held in the first processing iteration.

4. The analog-to-digital conversion method according to claim 1, wherein the reference signal is caused to have the same changing characteristics between the first processing iteration and the second processing iteration.

5. The analog-to-digital conversion method according to claim 1, wherein the count value held in the second processing iteration for a previous signal subject to processing is stored in a data storage unit, and when the first processing iteration and the second processing iteration are performed for a current signal subject to processing, the count value is read concurrently from the data storage unit based on a second high-speed clock composed of pulses having a frequency that is higher than the frequency of the master clock.

6. The analog-to-digital conversion method according to claim 5, wherein the frequency of the high-speed clock serving as a reference for the comparison and the counting in the two processing iterations and the frequency of the second high-speed clock serving as a reference for reading digital data from the data storage unit have such a relationship that the two processing iterations for the analog signal subject to processing are equal to a period of reading digital data of one line from the data storage unit.

7. The analog-to-digital conversion method according to claim 1, wherein the signal subject to processing is an analog unit signal that is generated by a unit-signal generator and output in a column direction in a semiconductor device for detecting a distribution of physical quantities, the semiconductor device including a matrix of unit elements, each of the unit elements including a charge generator that generates charges corresponding to incident electromagnetic wave and including the unit-signal generator that generates a unit signal corresponding to the charges generated by the charge generator.

8. The analog-to-digital conversion method according to claim 7, wherein the analog unit signal generated by the unit-signal generator and output in the column direction is captured on a row-by-row basis, and the first processing iteration and the second processing iteration are performed for each of the unit elements on the row-by-row basis.

9. The analog-to-digital conversion method according to claim 1, wherein the digital data converted into parallel n-bit digital data, where n is a positive integer, is received in synchronization with a high-speed clock for synchronization, the parallel n-bit digital data is output from a data output terminal, and the high-speed clock for synchronization is output from an output terminal that is different from the data output terminal.

10. The analog-to-digital conversion method according to claim 1, wherein output data in a predetermined format, the output data being based on the digital data converted, is output based on a read clock that is faster than the high-speed counter clock.

11. The analog-to-digital conversion method according to claim 10, wherein the digital data converted into parallel n-bit data, where n is a positive integer, is received in synchronization with the high-speed counter clock, the parallel n-bit data is converted into serial n-bit output data using a read clock that is faster than the high-speed counter clock, and the serial n-bit output data is output.

12. The analog-to-digital conversion method according to claim 10, wherein the digital data converted into parallel n-bit data, where n is a positive integer, is received in synchronization with the high-speed counter clock, the parallel n-bit data is converted into serial n-bit output data using a read clock that is faster than the high-speed counter clock, the serial n-bit output data is output, strobe data that allows reproducing the read clock is generated, and the strobe data is output from a terminal that is different from a terminal from which the serial n-bit output data is output.

13. The analog-to-digital conversion method according to claim 12, wherein the strobe data is generated by taking exclusive OR with the serial n-bit output data.

14. An analog-to-digital converter for obtaining digital data of a difference signal component representing a difference between a reference component and a signal component included in an analog signal, the analog-to-digital converter comprising:
a comparator that compares a signal corresponding to the reference component and a signal corresponding to the signal component with a reference signal for conversion into digital data; and
a counter that performs counting in a down-count mode or an up-count mode concurrently with the comparison in the comparator, based on a high-speed counter clock composed of pulses having a frequency that is higher than a frequency of a master clock composed of base pulses corresponding to driving pulses for capturing the analog signal subject to processing, the counter holding a count value at a time of completion of the comparison in the comparator.

15. The analog-to-digital converter according to claim 14, further comprising a high-speed-clock generator that generates the high-speed counter clock based on the master clock.

16. The analog-to-digital converter according to claim 14, further comprising a reference-signal generator that generates the reference signal for conversion into digital data and that supplies the reference signal to the comparator.

17. The analog-to-digital converter according to claim 16, wherein the reference-signal generator causes the reference signal to have the same changing characteristics between a first processing iteration and a second processing iteration.

18. The analog-to-digital converter according to claim 14, further comprising a controller that switches mode of counting in the counter according to whether the comparator is performing comparison for the reference component or the signal component.

19. The analog-to-digital converter according to claim 18, wherein the controller starts counting in a second processing iteration from a count value held in a first processing iteration.

20. The analog-to-digital converter according to claim 14, wherein the counter is implemented by a common counter circuit that is allowed to switch between the up-count mode and the down-count mode.

21. The analog-to-digital converter according to claim 14, further comprising:
a data storage unit that holds the count value held by the counter for a previous signal subject to processing;
a high-speed-clock generator that generates a second high-speed clock composed of pulses having a frequency that is higher than the frequency of the master clock; and
a reading scanner that reads the count value from the data storage unit based on the second high-speed clock generated by the high-speed-clock generator, concurrently with the comparator and the counter performing respective operations on a current signal subject to processing.

22. The analog-to-digital converter according to claim 14, further comprising an output processor that receives the digital data converted into parallel n-bit data, where n is a positive integer, in synchronization with a high-speed clock for synchronization, that outputs the parallel n-bit digital data from a data output terminal to the outside of the analog-to-digital converter, and that outputs the high-speed clock for synchronization to the outside of the analog-to-digital converter from an output terminal that is different from the data output terminal.

23. The analog-to-digital converter according to claim 14, further comprising an output processor that outputs output data in a predetermined format, the output data being based on the digital data converted, to the outside of the analog-to-digital converter based on a read clock that is faster than the high-speed counter clock.

24. The analog-to-digital converter according to claim 23, wherein the output processor receives the digital data converted into parallel n-bit data, where n is a positive integer, in synchronization with the high-speed counter clock, converts the parallel n-bit data into serial n-bit output data using a read clock that is faster than the high-speed counter clock, and outputs the serial n-bit output data.

25. The analog-to-digital converter according to claim 23, wherein the output processor includes:
a parallel-to-serial converter that receives the digital data converted in to parallel n-bit data, where n is a positive integer, in synchronization with the high-speed counter clock and that converts the parallel n-bit data into serial n-bit output data using a read clock that is faster than the high-speed counter clock;
a data output terminal for outputting the serial n-bit output data generated by the parallel-to-serial converter to the outside of the analog-to-digital converter;
a strobe-data generator that generates strobe data that allows reproducing the read clock; and
a strobe output terminal for outputting the strobe data generated by the strobe-data generator to the outside of the analog-to-digital converter, the strobe output terminal being different from the data output terminal.

26. The analog-to-digital converter according to claim 25, wherein the strobe-data generator generates the strobe data by taking exclusive OR with the serial n-bit data.

27. A semiconductor device for detecting a distribution of physical quantities, the semiconductor device including a matrix of unit elements, each of the unit elements including a charge generator that generates charges corresponding to incident electromagnetic wave and including a unit-signal generator that generates an analog unit signal including a reference component and a signal component, the semiconductor device comprising:
- a comparator that compares a signal corresponding to the reference component and a signal corresponding to the signal component with a reference signal for generating digital data of the signal component; and
- a counter that performs counting in a down-count mode or an up-count mode concurrently with the comparison in the comparator, based on a high-speed counter clock composed of pulses having a frequency that is higher than a frequency of a master clock composed of base pulses corresponding to driving pulses for capturing the analog unit signal, the counter holding a count value at a time of completion of the comparison in the comparator.

28. The semiconductor device according to claim 27, further comprising a high-speed-clock generator that generates a high-speed clock for generating the high-speed counter clock based on the master clock.

29. The semiconductor device according to claim 27, further comprising a reference-signal generator that generates the reference signal for generating digital data and that supplies the reference signal to the comparator.

30. The semiconductor device according to claim 27, further comprising a controller that switches mode of counting in the counter according to whether the comparator is performing comparison for the reference component or the signal component.

31. The semiconductor device according to claim 27, further comprising a plurality of analog-to-digital converters each including the comparator and the counter, the plurality of analog-to-digital converters being arrayed in a row direction in which columns of the unit elements are arrayed.

32. The semiconductor device according to claim 27, further comprising:
- a data storage unit that holds the count value held by the counter for a previous unit signal;
- a high-speed-clock generator that generates a second high-speed clock composed of pulses having a frequency that is higher than the frequency of the master clock; and
- a reading scanner that reads the count value from the data storage unit based on the second high-speed clock generated by the high-speed-clock generator, concurrently with the comparator and the counter performing respective operations on a current unit signal.

33. The semiconductor device according to claim 27, further comprising an output processor that receives the digital data converted into parallel n-bit data, where n is a positive integer, in synchronization with a high-speed clock for synchronization, that outputs the parallel n-bit digital data from a data output terminal to the outside of the semiconductor device, and that outputs the high-speed clock for synchronization to the outside of the semiconductor device from an output terminal that is different from the data output terminal.

34. The semiconductor device according to claim 27, further comprising an output processor that outputs output data in a predetermined format, the output data being based on the digital data converted, to the outside of the semiconductor device based on a read clock that is faster than the high-speed counter clock.

35. The semiconductor device according to claim 34, wherein the output processor receives the digital data converted into parallel n-bit data, where n is a positive integer, in synchronization with the high-speed counter clock, converts the parallel n-bit data into serial n-bit output data using a read clock that is faster than the high-speed counter clock, and outputs the serial n-bit output data.

36. The semiconductor device according to claim 34, wherein the output processor includes:
- a parallel-to-serial converter that receives the digital data converted in to parallel n-bit data, where n is a positive integer, in synchronization with the high-speed counter clock and that converts the parallel n-bit data into serial n-bit output data using a read clock that is faster than the high-speed counter clock;
- a data output terminal for outputting the serial n-bit output data generated by the parallel-to-serial converter to the outside of the semiconductor device;
- a strobe-data generator that generates strobe data that allows reproducing the read clock; and
- a strobe output terminal for outputting the strobe data generated by the strobe-data generator to the outside of the semiconductor device, the strobe output terminal being different from the data output terminal.

37. An electronic apparatus comprising:
- a reference-signal generator that generates a reference signal used for obtaining digital data of a difference signal component representing a difference between a reference component and a signal component included in an analog signal;
- a comparator for comparing a signal corresponding to the reference component and a signal corresponding to the signal component with the reference signal generated by the reference-signal generator;
- a high-speed-clock generator that generates a high-speed counter clock based on a master clock, the master clock being composed of base pulses corresponding to driving pulses for capturing the analog signal subject to processing, and the high-speed counter clock being composed of pulses having a frequency that is higher than a frequency of the master clock;
- a counter that performs counting in a down-count mode or an up-count mode based on the high-speed counter clock concurrently with the comparison in the comparator, the counter holding a count value at a time of completion of the comparison in the comparator; and
- a controller that switches mode of counting in the counter according to whether the comparator is performing comparison for the reference component or the signal component.

38. The electronic apparatus according to claim 37, further comprising:
- a data storage unit that holds the count value held by the counter for a previous signal subject to processing;
- a high-speed-clock generator that generates a high-speed clock composed of pulses having a frequency that is higher than the frequency of the master clock; and
- a reading scanner that reads the count value from the data storage unit based on the high-speed clock generated by the high-speed-clock generator, concurrently with the comparator and the counter performing respective operations on a current unit signal.

39. The electronic apparatus according to claim 37, further comprising an output processor that outputs output data in a predetermined format, the output data being based on the digital data converted, to the outside of the electronic apparatus based on a read clock that is faster than the high-speed counter clock.

40. The electronic apparatus according to claim 39, wherein the output processor receives the digital data converted into parallel n-bit data, where n is a positive integer, in synchronization with the high-speed counter clock, converts the parallel n-bit data into serial n-bit output data using a read clock that is faster than the high-speed counter clock, and outputs the serial n-bit output data.

41. The electronic apparatus according to claim 39, wherein the output processor includes:

a parallel-to-serial converter that receives the digital data converted in to parallel n-bit data, where n is a positive integer, in synchronization with the high-speed counter clock and that converts the parallel n-bit data into serial n-bit output data using a read clock that is faster than the high-speed counter clock;

a data output terminal for outputting the serial n-bit output data generated by the parallel-to-serial converter to the outside of the electronic apparatus;

a strobe-data generator that generates strobe data that allows reproducing the read clock; and a strobe output terminal for outputting the strobe data generated by the strobe-data generator to the outside of the electronic apparatus, the strobe output terminal being different from the data output terminal.

* * * * *